(12) United States Patent
Bosshart et al.

(10) Patent No.: US 6,242,952 B1
(45) Date of Patent: Jun. 5, 2001

(54) INVERTING HOLD TIME LATCH CIRCUITS, SYSTEMS, AND METHODS

(75) Inventors: Patrick W. Bosshart, Plano; Paul E Landman, Allen, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/405,688

(22) Filed: Sep. 24, 1999

(51) Int. Cl.$^7$ ...................... H03K 19/096; H03K 19/094

(52) U.S. Cl. ............................................. 326/98; 326/112

(58) Field of Search .................................. 326/93, 95, 98, 326/119, 112, 121

(56) References Cited

U.S. PATENT DOCUMENTS

| | | | |
|---|---|---|---|
| 4,841,174 | * | 6/1989 | Chung et al. ........................... 326/45 |
| 5,892,372 | * | 4/1999 | Ciraula et al. ......................... 326/96 |
| 5,942,917 | * | 8/1999 | Chappell et al. ..................... 326/121 |
| 6,049,231 | * | 4/2000 | Bosshart et al. ......................... 36/98 |

* cited by examiner

Primary Examiner—Michael Tokar
Assistant Examiner—James H. Cho
(74) Attorney, Agent, or Firm—Robert D. Marshall, Jr.; W. James Brady, III; Frederick J. Telecky, Jr.

(57) ABSTRACT

A domino logic circuit (18) comprising a first phase domino logic circuit (20) operable in a precharge phase and an evaluate phase. The first phase domino logic circuit comprises a precharge ($20_{PN}$) node operable to change states. The domino logic circuit also comprises a second phase domino logic circuit (22) operable in a precharge phase and an evaluate phase, wherein the precharge phase and the evaluate phase of the first phase domino logic circuit are out of phase with respect to the precharge phase and an evaluate phase of the second phase domino logic circuit. Further, the second phase domino logic circuit comprises a precharge node ($22_{PN}$) operable to change states in response to the states of the first phase domino logic circuit. Each of the first and second phase domino logic circuits further comprises a coupling device ($20_{PT}$, $22_{PT}$) which when conducting couples the precharge node to a precharge voltage during a precharge phase and a discharge path ($20_L$, $20_{DT}$; $22_L$, $22_{DT}$) corrected to the precharge node which when conducting couples the precharge node to a voltage different than the precharge voltage during an evaluate phase, wherein the discharge path comprises logic circuitry. The first phase domino logic circuit is operable such that the precharge node of the first phase domino logic circuit is charged to a first state during the precharge phase of the first phase domino logic circuit, and the precharge node of the first phase domino logic circuit conditionally changes to a second state during the evaluate phase of the first phase domino logic circuit. The second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit.

23 Claims, 8 Drawing Sheets

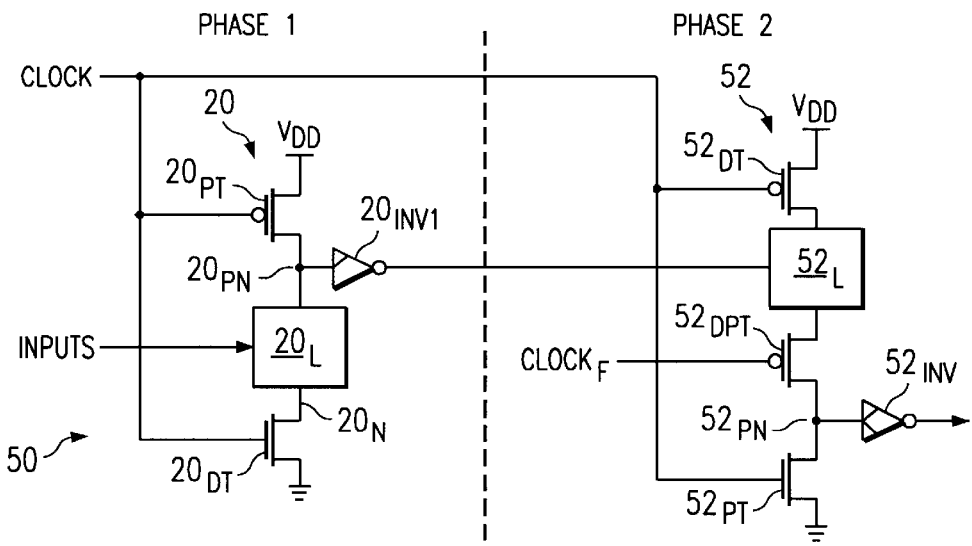
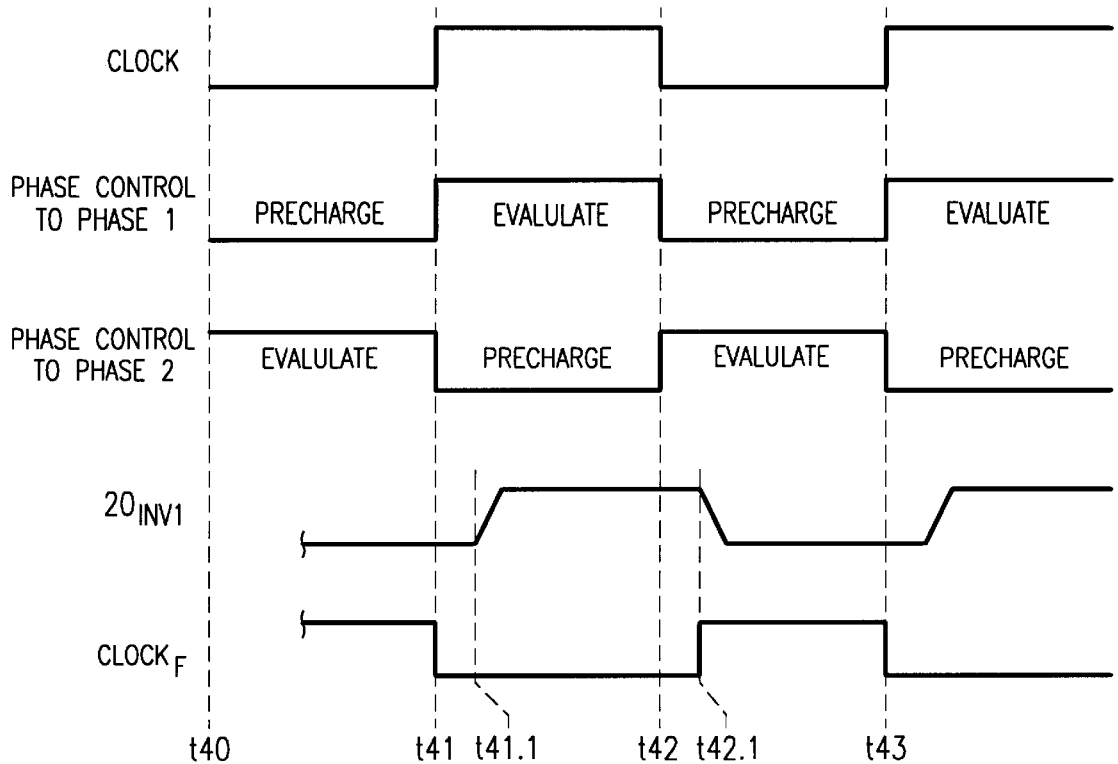
FIG. 5a
FIG. 5b

INVERTING HOLD TIME LATCH CIRCUITS, SYSTEMS, AND METHODS

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to domino logic technology, and are more particularly directed to hold time latch circuits, systems, and methods.

In many modern circuit applications, it is often desirable to increase operational speed. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time.

To increase the speed of microprocessors, as well as other circuits where speed is important, domino logic transistor circuits are currently used because they often provide increased speed as compared to static logic transistor circuits. A domino logic circuit is characterized by operating in two phases. First, a precharge node is set to a first potential during a precharge phase. Second, during an evaluate phase, if the logic condition represented by the circuit is satisfied, the precharged node is discharged, thereby changing the logic output of the circuit. In other words, at the conclusion of the precharge phase, the precharged node causes a first logic state to be output by the domino logic circuit. Thereafter, if the precharged node is discharged during the evaluate phase, the output of the domino logic circuit represents a second logic state differing from the first logic state. Moreover, the act of discharging to change states, when accomplished using one or more n-channel transistors to gate the transition from precharge to discharge, represents a speed increase over the prior operation of static circuits which in one instance accomplished a transition with a network of n-channel transistors while in another instance accomplished the opposite transition with a network of p-channel transistors.

One specific example of domino logic transistor circuits is known as a hold time latch, and is discussed in greater detail later. By way of introduction, the hold time latch generally follows the principles set forth above as characteristic of domino logic circuits. More particularly, during the precharge phase a first stage in the hold time latch precharges and correspondingly outputs a low voltage, and thereafter during an evaluate phase the first stage may output a high voltage if one or more logic conditions are satisfied. Further distinguishing the hold time latch from other domino circuits is that the hold time latch takes advantage of a delay in precharging the latch. Specifically, the hold time latch is connected to output a data signal to a subsequent domino logic stage, where the subsequent domino stage evaluates out of phase with respect to the hold time latch. Thus, when the first stage completes its evaluate phase, the subsequent stage then performs its evaluate phase based on the data from the hold time latch. Note, however, that at the same time the subsequent stage begins its evaluate phase, the first stage begins its precharge phase. By design, however, there is a slight delay of time from this point where the precharge phase begins, and even though the control signals have changed to cause the beginning of the precharge phase of the first stage of the hold time latch, the output of the hold time latch first stage from its preceding evaluate phase remains valid. It is during this time, known as the hold time, that the subsequent stage is typically able to trigger (i.e., evaluate) based on the valid data from the first stage. Consequently, data may propagate through this as well as similar connections without the need for complicated additional latching circuitry.

While the hold time latch is therefore beneficial in certain applications in the art, the present inventors have recognized that many newer circuit technologies require dual rail signals, or may otherwise provide situations that may benefit from a circuit that has a complementary output operation to the hold time latch. The present inventors have further recognized, however, that merely inverting each operation of a hold time latch will not produce a viable circuit for use in domino logic circuits. Specifically, recall from above that the output of the first stage of a hold time latch initially provides a low voltage, then conditionally rises to a high voltage (if logic is satisfied), and then returns to the low voltage. A strict complementary operation, therefore, would initially provide a high voltage, then conditionally fall to a low voltage, and then return to the high voltage. However, the present inventors further recognize that this operation is not compatible with a typical subsequent domino logic stage for various reasons, one of which is that the return of the complementary first stage to a high voltage would cause the subsequent domino logic to erroneously discharge. Accordingly, below the present inventors provide various embodiments to overcome any such incompatibility and thereby also provide the capability of a constrained complementary operating domino circuit referred to below as an inverting hold time latch.

BRIEF SUMMARY OF THE INVENTION

In the preferred embodiment, there is a domino logic circuit comprising a first phase domino logic circuit operable in a precharge phase and an evaluate phase. The first phase domino logic circuit comprises a precharge node operable to change states. The domino logic circuit also comprises a second phase domino logic circuit operable in a precharge phase and an evaluate phase, wherein the precharge phase and the evaluate phase of the first phase domino logic circuit are out of phase with respect to the precharge phase and an evaluate phase of the second phase domino logic circuit. Further, the second phase domino logic circuit comprises a precharge node operable to change states in response to the states of the first phase domino logic circuit. Each of the first and second phase domino logic circuits further comprises a coupling device which when conducting couples the precharge node to a precharge voltage during a precharge phase and a discharge path connected to the precharge node which when conducting couples the precharge node to a voltage different than the precharge voltage during an evaluate phase, wherein the discharge path comprises logic circuitry. The first phase domino logic circuit is operable such that the precharge node of the first phase domino logic circuit is charged to a first state during the precharge phase of the first phase domino logic circuit, and the precharge node of the first phase domino logic circuit conditionally changes to a second state during the evaluate phase of the first phase domino logic circuit. The second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit. Other circuits, systems, and methods are also disclosed and claimed.

BRIEF DESCRIPTION OF THE SEVERAL VIEWS OF THE DRAWING

FIG. 1b illustrates a timing diagram demonstrating the operation of the circuits of FIG. 1a;

FIG. 5a illustrates a schematic of a fourth inventive inverting hold time latch embodiment including a first domino logic circuit having a discharge path formed of transistors of a first conductivity type and a second domino logic circuit having a discharge path formed of transistors of a second conductivity type; and FIG. 5b illustrates a timing diagram demonstrating the operation of the circuits of FIG. 5a wherein the first domino logic circuit is discharged during its evaluate phase.

DETAILED DESCRIPTION OF THE INVENTION

Figure 1A:
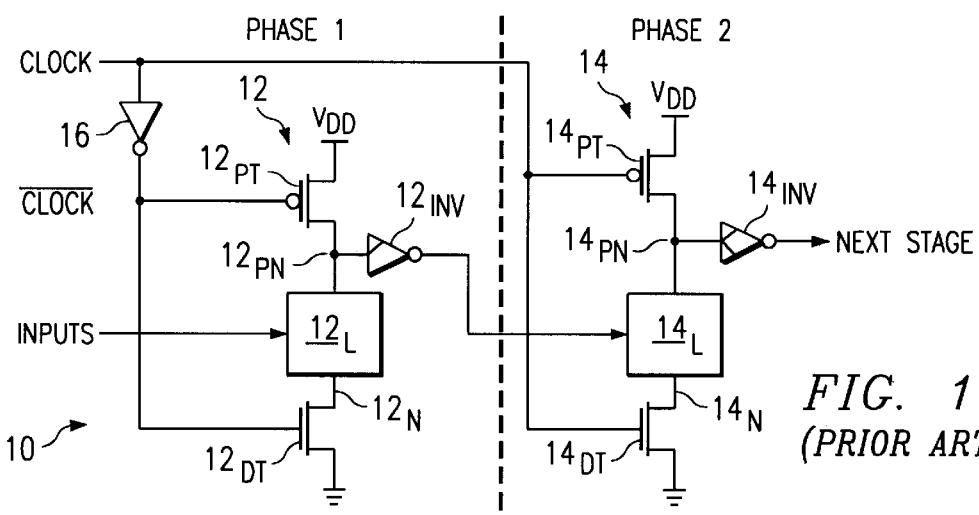
FIG. 1a illustrates a schematic of a prior art domino logic circuit connected as a hold time latch and operating according to a first phase, and outputting a signal forming an input to a successive domino logic circuit operating according to a second phase.

By way of further introduction to the preferred embodiments discussed later, FIG. 1a illustrates a schematic of a prior art domino circuit system designated generally at 10, and which in the art is sometimes referred to as a hold time latch. System 10 includes circuitry operating in two different phases and, therefore, a vertical dashed line generally separates those phase circuits. Looking to the left of the dashed line, a phase 1 circuit 12 includes a domino logic circuit stage, which includes a precharge transistor $12_{PT}$, a precharge node $12_{PN}$, an output inverter $12_{INV}$, and a discharge path including both a logic circuit $12_L$ and a discharge transistor $12_{DT}$. To the right side of the dashed line of to FIG. 1a is a phase 2 circuit 14 which includes a domino logic stage, and which is simlilarly connected to include a precharge transistor $14_{PT}$, a precharge node $14_{PN}$, an output inverter $14_{INV}$, and a discharge path including both a logic circuit $14_L$, and a discharge transistor $14_{DT}$. Still further, system 10 includes a conductor for providing a CLOCK signal. The CLOCK signal is connected through an inverter 16 to the gates of precharge transistor $12_{PT}$ and discharge transistor $12_{DT}$ and is connected directly to the gates of precharge transistor $14_{PT}$ and discharge transistor $14_{DT}$. A more detailed discussion of the various connections and interactions of phase circuits 12 and 14 is provided immediately below.

With respect to phase 1 circuit 12, precharge transistor $12_{PT}$ is a p-channel transistor which is typically smaller than the n-channel transistors shown in FIG. 1a. Precharge transistor $12_{PT}$ has a source connected to a source of the system voltage level (e.g., $V_{DD}$) and a drain connected to precharge node $12_{PN}$. As noted above, the complement of the CLOCK signal (i.e., $\overline{CLOCK}$) is connected to the gate of precharge transistor $12_{PT}$ and is also connected to the gate of discharge transistor $12_{DT}$. Discharge transistor $12_{DT}$ is an n-channel transistor having its source connected to a low reference voltage (e.g., ground) and its drain connected to a node $12_N$. Between precharge node $12_{PN}$ and node $12_N$ is connected a logic circuit $12_L$. The particular logic of logic circuit $12_L$ may implement any type of logic equation. For example, often logic circuit $12_L$ includes numerous n-channel transistors connected in various fashions to implement a logic equation, and the logic function of that equation is determined based on the particular transistor configuration as well as the respective input signals connected to the gates of those transistors. For purposes of the present discussion, the particular logic equation and inputs are not important and, thus, the word INPUTS is generally shown with it understood that such signals may come from any of various other circuits, being static, dynamic, or both. What is noteworthy, however, is that once the logic equation formed by logic circuit $12_L$ is true, a conductive path is formed through logic circuit $12_L$ connecting precharge node $12_{PN}$ to node $12_N$. Further, recall that the complement of the CLOCK signal is connected to the gate of discharge transistor $12_{DT}$. Thus, when the CLOCK is low its complement is high and the discharge transistor $12_{DT}$ is also conducting; if this conduction occurs while the logic equation implemented by logic circuit $12_L$ is true, then a discharge path is created from precharge node $12_{PN}$, through logic circuit $12_L$ and discharge transistor $12_{DT}$, to ground such that the precharge voltage (i.e., $V_{DD}$) at precharge node $12_{PN}$ is permitted to discharge to ground.

Returning to precharge node $12_{PN}$, it is further connected to the input of output inverter $12_{INV}$. The output of output inverter $12_{INV}$ provides the output signal for circuit 12 (i.e., the result of the logic equation of logic circuit $12_L$). Note that output inverter $12_{INV}$ is shown as having a short diagonal line in the upper half of the inverter symbol. For purposes of this document, the upper diagonal line of this symbol is included as a convention to demonstrate that a p-channel transistor (not expressly illustrated) is connected in a feedback manner from the output of the inverter to its input. More particularly with respect to the p-channel feedback transistor, its gate is connected to the output of the corresponding inverter, the source of the feedback p-channel transistor is connected to $V_{DD}$), and the drain of the feedback p-channel transistor is connected to the input of the corresponding inverter. One skilled in the art will therefore appreciate that once the precharge voltage is no longer connected to a given precharge node in FIG. 1a (e.g., during the evaluate phase described below), the feedback p-channel transistor will maintain a high signal at the input of the inverter so long as the precharge node is not discharged by its corresponding discharge path.

With respect to phase 2 circuit 14, note that its circuit elements are generally connected in the same manner as phase 1 circuit 12 detailed above, with the exception of the inputs to its logic circuit $14_L$, as well as the output of phase 2 circuit 14, and note that its inverter $14_{INV}$ is shown as having a short diagonal line in both the upper half and lower half of the inverter symbol. The upper diagonal line of this symbol is included according to the same convention described earlier with respect to inverter $12_{INV}$, that is, to demonstrate that a p-channel transistor (not expressly illustrated) is connected in a feedback manner from the output of the inverter to its input. The lower diagonal line of this symbol is included as a convention to demonstrate that an n-channel transistor (not expressly illustrated) is connected in a feedback manner from the output of the inverter to its input. More particularly, the n-channel transistor is connected such that its gate is connected to the output of the inverter, its source is connected to ground, and its drain is connected to the input of the inverter. One skilled in the art will therefore appreciate that if an input signal first enables logic circuit $14_L$ to conduct but then that signal is no longer enabling during the evaluate phase, the feedback n-channel transistor will maintain a low signal at the input of the inverter until the precharge node is once again precharged by enabling precharge transistor $14_{PT}$. Lastly, the remaining inputs and outputs of phase 2 circuit 14 are discussed below while the other circuit details are not re-stated here since the reader is referred to the above discussion of phase 1 circuit 12 for comparable details.

Turning to the input of phase 2 circuit 14, note that at least one of the inputs to its logic circuit $14_L$ is provided by the output of phase 1 circuit 12 and, in this regard, a connection is shown from output inverter $12_{INV}$ to logic circuit $14_L$. Logic circuit $14_L$, like logic circuit $12_L$, also realizes a logic equation, typically using one or more n-channel transistors. Again, the particular equation realized is not critical, but for reasons set forth below it should be noted that at least one of the inputs to perform the equation of logic circuit $14_L$ requires an input signal which is output from phase 1 circuit 12. Thus, note that logic circuit $14_L$ will properly evaluate its logic equation only if a valid output is provided by inverter $12_{INV}$ to logic circuit $14_L$.

Turning to the output of phase 2 circuit 14, it is shown to merely pass on to a next stage (not shown). This illustration is shown in this manner by way of example and, therefore, the connectivity to the output is not critical to an understanding of the present introductory discussion. Thus, the output could connect to various different circuits, such as: (1) a circuit operating according to the same phase as phase 2 circuit 14; (2) a circuit operating according to the same phase as phase 1 circuit 12; (3) a circuit operating according to a phase different than both phase 1 and phase 2 circuits 12 and 14, respectively; or (4) a static circuit as opposed to a phase-controlled circuit.

Figure 1B:
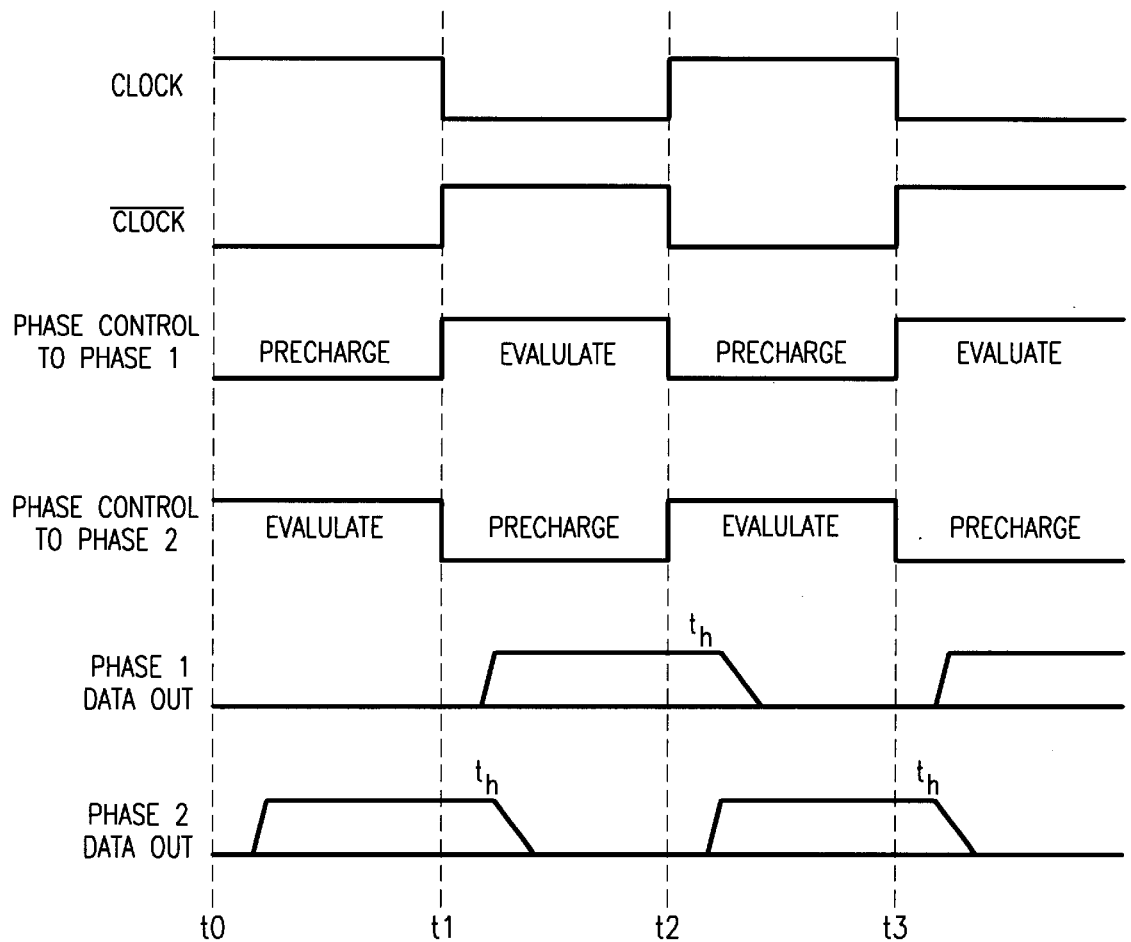

The operation of system 10 is understood with reference to the prior art timing diagram of FIG. 1b. Before studying that Figure, however, note that system 10 does not include separate complex latch structures between the output of phase 1 circuit 12 and the input to phase 2 circuit 14; the ability for system 10 to operate despite this lack of additional structure is now explained in connection with FIG. 1b. Turning to FIG. 1b, first is presented an introduction to its signal rows which are discussed from top to bottom, and then following is a detailed analysis of the operation depicted by those signals. The first (i.e., top) row of FIG. 1b merely shows the state of the CLOCK signal, and the second row shows its complement, $\overline{\text{CLOCK}}$, since that complementary signal is used to control the gates of precharge transistor $12_{PT}$ and discharge transistor $12_{DT}$. The third and fourth rows show the phase control signals as applied to phase 1 circuit 12 and phase 2 circuit 14, respectively. The fifth and sixth rows of FIG. 1b depict the data values output by phase 1 circuit 12 and phase 2 circuit 14, respectively.

Looking to the specific signals of FIG. 1b, assume by a time t0 that system 10 is running at a steady-state. Between t0 and t1, the CLOCK signal is high. As a result of the high CLOCK signal, phase 1 circuit 12 is in a precharge phase of operation. More specifically with respect to phase 1 circuit 12, note that the high CLOCK signal is inverted so that the $\overline{\text{CLOCK}}$ signal is applied to the gates of p-channel precharge transistor $12_{PT}$ and n-channel discharge transistor $12_{DT}$. In response and due to the conductivity types of these transistors, this causes precharge transistor $12_{PT}$ to conduct while discharge transistor $12_{DT}$ does not conduct. The conduction of precharge transistor $12_{PT}$ causes precharge node $12_{PN}$ to rise to $V_{DD}$ and this signal is inverted by output inverter $12_{INV}$, thereby causing the output of phase 1 circuit 12 (i.e., fifth row of FIG. 1b) to be a logic low between t0 and t1. Note further that, in response to the high CLOCK signal between t0 and t1, phase 2 circuit 14 is in an evaluate phase of operation. Thus, phase 2 circuit 14 operates out of phase with respect to phase 1 circuit 12. More specifically, the high CLOCK signal is connected directly to the gates of p-channel precharge transistor $14_{PT}$ and n-channel discharge transistor $14_{DT}$. In response and due to the conductivity types of these transistors, precharge transistor $14_{PT}$ does not conduct while discharge transistor $14_{DT}$ does conduct. The conduction of discharge transistor $14_{DT}$ places phase 2 circuit 14 in its evaluate phase, and if the logic equation realized by logic circuit $14_L$ is true, then the previous precharged voltage at precharge node $14_{PN}$ discharges through the discharge path formed by logic circuit $14_L$ and discharge transistor $14_{DT}$ to ground. In this case, the voltage at precharge node $14_{PN}$ is inverted by output inverter $14_{INV}$, thereby causing the output of phase 2 circuit 14 (i.e., sixth row of FIG. 1b) to rise to a logic high between t0 and t1.

At t1, the clock signal to both phase circuits 12 and 14 transitions to an opposite level. Thus, at t1, phase 2 circuit 14 has finished its evaluate phase of operation and, therefore, valid data exists at the output of inverter $14_{INV}$. Immediately after t1, however, the signal at the gate of p-channel precharge transistor $14_{PT}$ transitions from high to low. Note, therefore, that p-channel precharge transistor $14_{PT}$ begins to conduct and the voltage at precharge node $14_{PN}$ begins to rise (assuming it was discharged in the inmmediately preceding evaluate phase). However, due to the delay in response time of the p-channel precharge transistor $14_{PT}$, some amount of time passes before precharge node $14_{PN}$ precharges from low to a full high level. As a result, a corresponding amount of time after t1, and indicated as $t_h$, on FIG. 1b, passes before the output of phase 2 circuit 14 (i.e., the output of inverter $14_{INV}$) transitions from high to low due to the precharge effect. In other words, the data output by phase 2 circuit 14 is held (i.e. remains valid) for some short period or "hold time," denoted as $t_h$, even though the clock signal connected to that circuit has now switched to cause its stage(s) to change from the evaluate phase of operation to the precharge phase of operation.

In addition to the holding of data by phase 2 circuit 14 as described above, note further after t1 that phase 1 circuit 12 is in its evaluate phase of operation (e.g., its discharge transistor $12_{DT}$ is conducting due to the transition of the CLOCK signal). Thus, phase 1 circuit 12 makes its evaluation based on the inputs it receives, and if its discharge path discharges its precharge node $12_{PN}$, then its output rises shortly after t1 as shown in the fifth row of FIG. 1b.

With the operation of phase 2 circuit 14 described above with respect to its hold time, the operation of phase 1 circuit 12 as a hold time latch is apparent after t2 and with respect to the data it provides to phase 2 circuit 14. Specifically, at t2, the CLOCK signal again transitions. In response, the phase control to phase 1 circuit 12 causes circuit 12 to precharge while the phase control to phase 2 circuit 14 causes circuit 14 to evaluate. With respect to phase 1 circuit 12, however, note again that some time is required after t2 before its p-channel precharge transistor $12_{PT}$ pulls its precharge node $12_{PN}$ to $V_{DD}$. During this time, therefore, the data output from phase 1 circuit 12 temporarily remains valid as shown after t2 in the fifth row of FIG. 1b and, again, this time is shown as a hold time, $t_h$. Also during this hold time, recall that phase 2 circuit 14 has now been switched to perform its evaluate phase. Thus, provided that the th of phase 1 circuit 12 is sufficiently long after t2, phase 2 circuit 14 may perform its evaluation based on its inputs, which include the temporarily valid data output by phase 1 circuit 12. Again, therefore, phase 2 circuit 14 evaluates, and if its logic equation is true, its precharge node $14_{PN}$ is discharged, thereby generating a rising output some time shortly after t2 as shown in the bottom row of FIG. 1b. Consequently, note now that the successive connection of the output from phase 1 circuit 12 to the input of phase 2 circuit 14 permits an evaluation by phase 2 circuit 14 based on data from the preceding circuit 12, but without the requirement of additional latches. Still further, one skilled in the art will appreciate from the remainder of FIG. 1b that this concept continues to apply as data continues in the fashion between the two phase circuits of FIG. 1a. Moreover, this same aspect would further apply if system 10 included additional successive circuits clocked to precharge at different times, or if each phase circuit included more than one domino logic stage connected to the clock of that phase circuit. Additionally, note that FIG. 1a is simplified to show only two successive circuits; in actuality, when not simplified, one or more of the circuits within FIG. 1a are typically a portion of a larger circuit which may be mixed with latched inputs to one or more of the phase circuits.

From the preceding discussion, the operation of a hold time latch and system 10 are now summarized, as will be helpful for later contrast with the preferred embodiments. Specifically, the preceding demonstrates that the output of phase 1 circuit 12 during its precharge phase represents an unconditional low output, and that output conditionally rises only if the discharge path of phase 1 circuit 12 is enabled during its evaluate phase, that is, only if discharge transistor $12_{DT}$ is conducting and logic circuit $12_L$ realizes a true equation during that evaluate phase. Further in this regard, note that the term "enable" and variations thereof are known in the art and are used in this manner in the present document, where the terms indicate that the gate potential to the transistor is sufficient to cause conduction along the conductive path (i.e., the source/drain) of the transistor to which the gate potential is connected. Similarly, in the present document the term disabled or disabling are used in opposite fashion to indicate that the gate potential to the transistor is insufficient to cause conduction along the conductive path of the transistor(s). Looking to the operation of phase 2 circuit 14, during its precharge phase its output also represents an unconditional low output. Moreover, during the evaluate phase of phase 2 circuit 14, its output conditionally rises only if its discharge path is enabled, and this can occur only if the output of phase 1 circuit 12 was enabled during the most recent evaluate phase of phase 1 circuit 12 because only in this event may an enabling signal be presented from phase 1 circuit 12 to logic circuit $14_L$ of phase 2 circuit 14.

Given the preceding summary of the operation of a hold time latch, still further observations may be made about that operation, again for the useful purpose of later contrasting the preferred embodiments. The preceding summary demonstrates that precharge node $14_{PN}$ may discharge in the evaluate phase of phase 2 circuit 14 only if precharge node $12_{PN}$ discharges in the immediately preceding evaluate phase of phase 1 circuit 12. Further, the discharge of either precharge node $14_{PN}$ or $12_{PN}$ changes the state of the output of the corresponding phase circuit. Thus, an alternative way of stating the preceding is that for a prior art hold time latch, its second stage can change state during its evaluate phase only if its first stage changed state during its immediately preceding evaluate phase. To the contrary, if precharge node $12_{PN}$ does not discharge for a given evaluate phase of phase 1 circuit 12, then precharge node $14_{PN}$ cannot discharge in the next successive evaluate phase of phase 2 circuit 14. Thus, for a prior art hold time latch, its second stage cannot change state during its evaluate phase if its first stage did not change state during its inmmediately preceding evaluate phase.

Figure 2A:
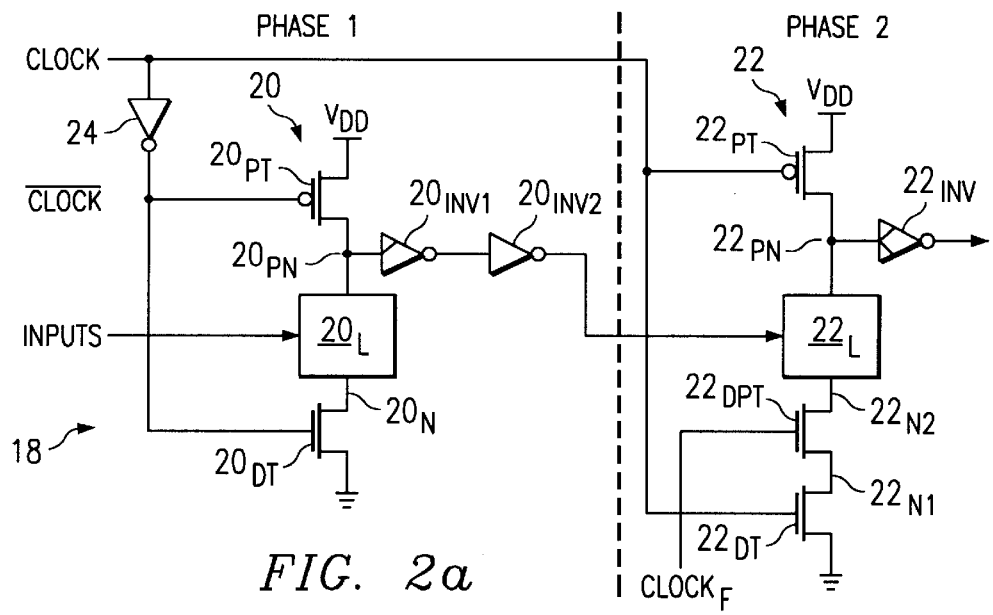
FIG. 2a illustrates a schematic of a first inventive inverting hold time latch embodiment including a first domino logic circuit with a first and second output inverter, where the second output inverter provides an input to a second domino logic circuit, where the second domino logic circuit includes in its discharge path a discharge prevention transistor to prevent the second domino logic circuit from wrongfully discharging when the first stage output begins to unconditionally rise to a logic high.

FIG. 2a illustrates a schematic of a first inventive inverting hold time latch system designated generally at 18. System 18 in certain respects resembles system 10 of FIG. 1, above, yet to prevent confusion during the subsequent discussion different reference numerals are used in FIG. 2a. Nevertheless, the reader is assumed to be familiar with the prior discussion so that the details of various concepts are not re-stated below. Looking to system 18, it includes circuitry operating in different phases and again, therefore, a vertical dashed line generally separates those phase circuits. Looking to the left side of the vertical dashed line, a phase 1 circuit 20 includes a domino logic circuit stage, which includes a precharge transistor $20_{PT}$, a precharge node $20_{PN}$, a first output inverter $20_{INV1}$, and a discharge path including both a logic circuit $20_L$ and a discharge transistor $20_{DT}$. In addition and for reasons detailed below, phase 1 circuit 20 further includes a second output inverter $20_{INV2}$. To the right side of the vertical dashed line of FIG. 2a is a phase 2 circuit 22 which includes a domino logic stage, and which is connected to include a precharge transistor $22_{PT}$, a precharge node $22_{PN}$, an output inverter $22_{INV}$, and a discharge path including a logic circuit $22_L$ and a discharge transistor $22_{DT}$. In addition and for reasons detailed below, the discharge path of phase 2 circuit 22 further includes a discharge prevention transistor $22_{DPT}$. The use of the descriptor "discharge prevention transistor" is explained later. A control signal is connected to the gate of discharge prevention transistor $22_{DPT}$, and as detailed below this control signal may be created based on some enabling function working in relation to the CLOCK signal; thus, for the present embodiment, the control signal is designated as $CLOCK_F$, where one skilled in the art will recognize that the CLOCK signal may be modified in various manners to create such a signal, some of which are detailed later.

System 18 also includes a conductor for providing a CLOCK signal. With respect to phase 1 circuit 20, the CLOCK signal is connected through an inverter 24 such that its complement, $\overline{CLOCK}$, is connected to the gate of the gate of precharge transistor $20_{PT}$ and to the gate of discharge transistor $20_{DT}$. With respect to phase 2 circuit 22, the CLOCK signal is connected to the gate of precharge transistor $22_{PT}$ and to the gate of discharge transistor $22_{DT}$.

A more detailed description of the connections within phase 1 circuit 20 is as follows. Precharge transistor $20_{PT}$ is preferably a p-channel transistor having a source connected to a source of the system voltage level (e.g., $V_{DD}$), a drain connected to precharge node $20_{PN}$, and as noted above, the $\overline{CLOCK}$ signal connected to its gate. Additionally, the $\overline{CLOCK}$ signal is connected to the gate of the discharge transistor $20_{DT}$, which is preferably an n-channel transistor having its source connected to a low reference voltage (e.g., ground) and its drain connected to a node $20_N$. Between precharge node $20_{PN}$ and node $20_N$ is connected logic circuit $20_L$. The particular logic of logic circuit $20_L$ may implement any type of logic equation, with the equation ultimately determined based on the transistor configuration implementing the logic equation; for purposes of example and as further explored later, it is assumed for the present embodiment that logic circuit $20_L$ is formed using one or more n-channel transistors. The inputs to these transistors are generally shown as "INPUTS" in FIG. 2a, with it understood that such signals may come from various circuits, being static, dynamic, or both. Also, once the logic equation formed by logic circuit $20_L$ is true, a conductive path is formed through logic circuit $20_L$ connecting precharge node $20_{PN}$ to node $20_N$. Further, recall that the $\overline{CLOCK}$ signal is connected to the gate of discharge transistor $20_{DT}$. Thus, when the CLOCK signal is low its complement is high and discharge transistor $20_{DT}$ is also conducting; if this conduction occurs while the logic equation implemented by logic circuit $20_L$ is true, then a discharge path is created from precharge node $20_{PN}$ to ground such that the precharge voltage (i.e., $V_{DD}$) at precharge node $20_{PN}$ is permitted to discharge to ground.

Completing the connections of phase 1 circuit 20, recall that precharge node $20_{PN}$ is connected to the input of first output inverter $20_{INV1}$. First output inverter $20_{INV1}$ has a short diagonal line in the upper half of the inverter symbol. For purposes of this document, this symbol is included as a convention to demonstrate that a p-channel transistor (not expressly illustrated) is connected in a feedback manner from the output of the inverter to its input. More particularly, the gate of the feedback p-channel transistor is connected to the output of the corresponding inverter, the source of the feedback p-channel transistor is connected to $V_{DD}$, and the drain of the feedback p-channel transistor is connected to the input of the corresponding inverter. Note further that the output of first output inverter $20_{INV1}$ is connected to the input of second output inverter $20_{INV2}$. The output of second output inverter $20_{INV2}$ provides an input to phase 2 circuit 22; more particularly, the output of output inverter $20_{INV2}$ is connected as an input to the logic circuit $22_L$ of phase 2 circuit 22, which is described in greater detail immediately below.

A more detailed description of the connections within phase 2 circuit 22 is as follows. Precharge transistor $22_{PT}$ is preferably a p-channel transistor with a source connected to a source of the system voltage level (e.g., $V_{DD}$), a drain connected to precharge node $22_{PN}$, and a gate connected directly to the CLOCK signal. The CLOCK signal is also connected to the gate of discharge transistor $22_{DT}$, which preferably is an n-channel transistor having its source connected to a low reference voltage (e.g., ground) and its drain connected to a node $22_{N1}$. Also connected to precharge node $22_{PN}$ is logic circuit $22_L$, which is further connected to a node $22_{N2}$. The particular logic of logic circuit $22_L$ may implement any type of logic equation, with the equation determined by the transistor configuration implementing the logic equation; for purposes of example and as further explored later, it is assumed for the present embodiment that logic circuit $22_L$ is formed using the same conductivity type of transistor(s) as in logic circuit $20_L$ (i.e., n-channel transistors). As mentioned above, one of these inputs to logic circuit $22_L$ is provided by the output of phase 1 circuit 20 (i.e., from second output inverter $20_{INV2}$). However, additional inputs also may be received from other circuits as well. In any event, once the logic equation formed by logic circuit $22_L$ is true, a conductive path is formed through logic circuit $22_L$ connecting precharge node $22_{PN}$ to node $22_{N2}$. However, for node $22_{N2}$ to discharge, the entire discharge path must be enabled and, thus, both of discharge prevention transistor $22_{DPT}$ and discharge transistor $22_{DT}$ also must contemporaneously conduct. Further in this regard, node $22_{N2}$ is connected to the drain of discharge prevention transistor $22_{DPT}$ which has its source connected to node $22_{N1}$. Given these connections, during the phase when the CLOCK signal is high and thereby causes discharge transistor $22_{DT}$ to conduct, then node $22_{N1}$ discharges only if signal $CLOCK_F$ is also high during that phase (thereby causing discharge prevention transistor $22_{DPT}$ to conduct). The timing and other aspects of this discharge operation are explored in greater detail below. Lastly, note that precharge node $22_{PN}$ is connected to the input of an output inverter $22_{INV}$. Output inverter $22_{INV}$ is shown with a diagonal line in both its upper and lower half and, therefore, consistent with the above convention, it includes both an n-channel and p-channel feedback transistor configured in the manner described above. Lastly, note that the output of phase 2 circuit 22 is shown to merely pass on to a next stage (not shown) and this illustration is shown in this manner only by way of example. Therefore, the connectivity to the output is not critical to an understanding of the present embodiments, and the output could connect to various different dynamic or static circuits, where the former are either in phase or out of phase with respect to phase 2 circuit 22.

Figure 2B:
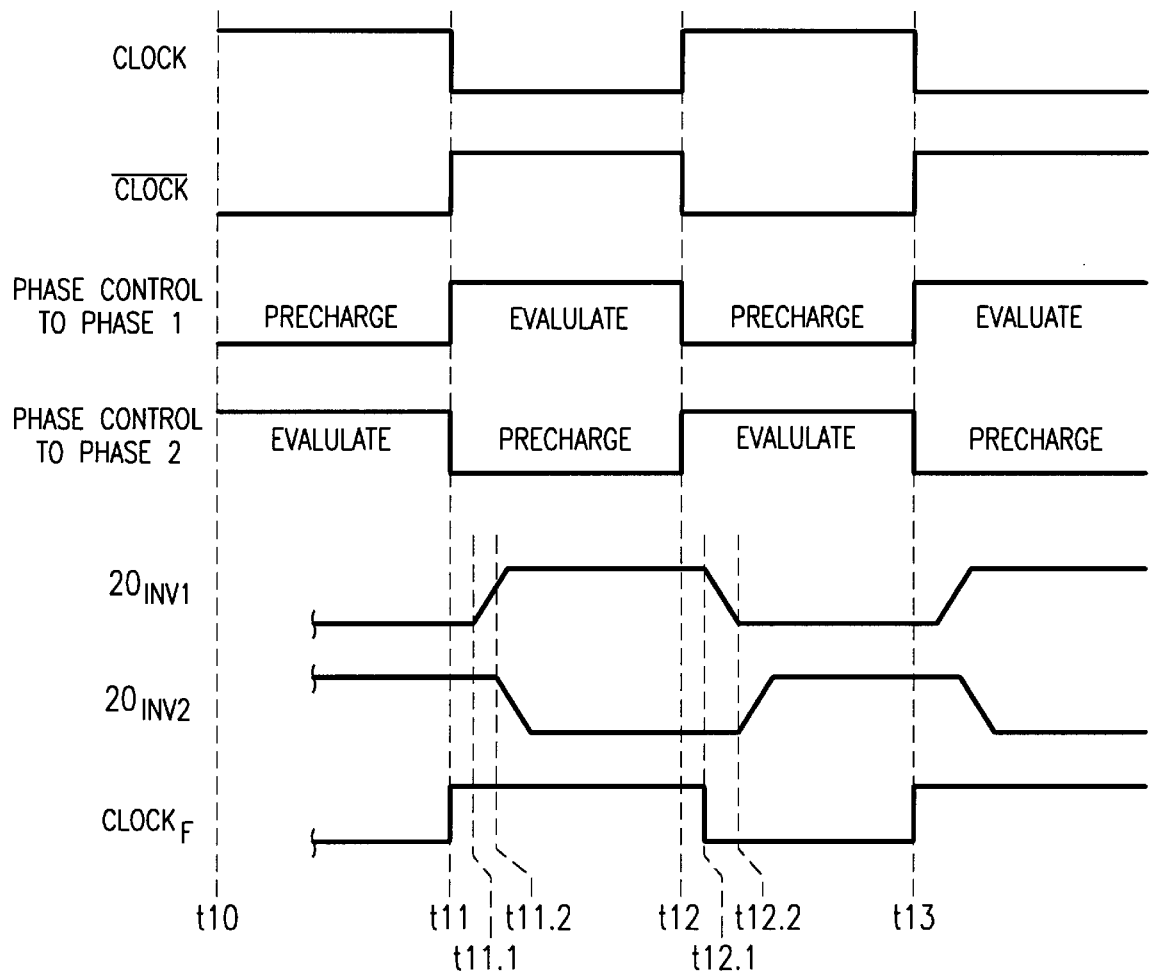
FIG. 2b illustrates a timing diagram demonstrating the operation of the circuits of FIG. 2a wherein the first domino logic circuit is discharged during its evaluate phase.
Figure 2C:
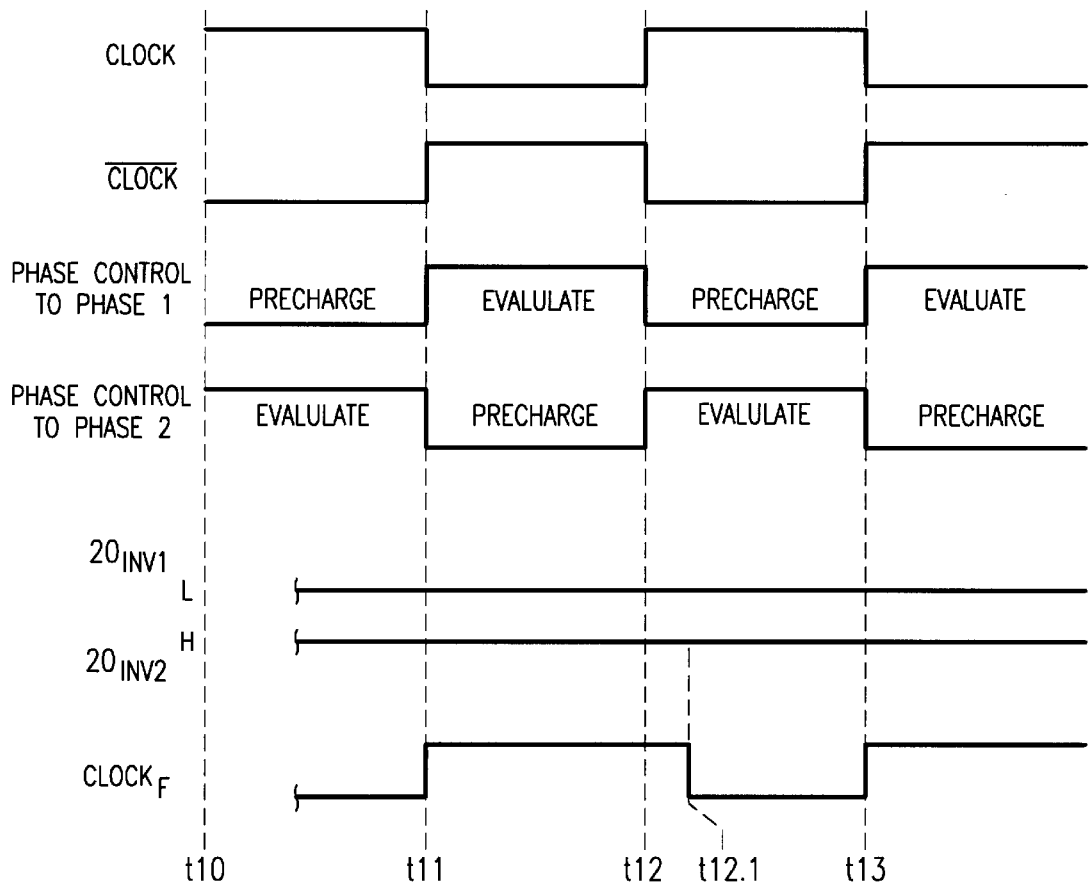
FIG. 2c illustrates a timing diagram demonstrating the operation of the circuits of FIG. 2a wherein the first domino logic circuit is not discharged during its evaluate phase.

The operation of system 18 is understood with reference to the timing diagrams of FIGS. 2b and 2c. FIGS. 2b and 2c illustrate voltages at the same nodes of system 18 and, thus, the rows of those Figures are now introduced with a separate discussion provided below for each Figure to demonstrate two different operational states of system 18. Turning in general to FIGS. 2b and 2c, and as an introduction to the rows from top to bottom of the Figures, the first row depicts the CLOCK signal which recall is connected directly to control the phase operation of phase 2 circuit 22, and the second row depicts the complemented clock signal, $\overline{\text{CLOCK}}$, which recall is connected directly to control the phase operation of phase 1 circuit 20. The third and fourth rows, respectively, show the phase control of phase 1 circuit 20 and phase 2 circuit 22. The fifth and sixth rows depict the outputs from phase 1 circuit 20; more particularly, the fifth row illustrates the output of inverter $20_{INV1}$ which is a one-inverter delayed complement of precharge node $20_{PN}$, and the sixth row illustrates the output of inverter $20_{INV2}$ which is a one-inverter delayed complement of the output of inverter $20_{INV1}$. The last row in FIGS. 2b and 2c illustrates the functional control signal $\text{CLOCK}_F$ which is used to control the gate of discharge prevention transistor $22_{DPT}$. Lastly, it is noted that for sake of simplifying the following discussion the clock related transitions are shown in FIGS. 2b and 2c as occurring instantaneously while one skilled in the art will readily acknowledge that delay transitions actually occur in the clock signal; further in this regard, such delay for transitions in the other signals of FIGS. 2b and 2c are shown since they are more closely examined in the remaining discussion of operation.

Turning now to the signals of FIG. 2b, by way of introduction it is noted that FIG. 2b illustrates the operation of system 18 in an instance where the discharge path of phase 1 circuit 20 is enabled which thereby discharges precharge node $20_{PN}$. Looking now at the specific signals, assume by a time t10 that system 18 is running at a steady-state. The signal transitions immediately after t10 need not be detailed at this point but will be appreciated as comparable to the repeated instances of those same transitions occurring after t12. Thus, looking generally from the middle of t10 forward, note that phase 1 circuit 20 is in its precharge phase of operation while phase 2 circuit 22 is clocked such that it is permitted to be in its evaluate phase of operation (i.e., its discharge transistor $22_{DT}$ is enabled). Regarding the latter, therefore, phase 2 circuit 22 is outputting data in response to its evaluation (although not shown in FIG. 2b).

At t11, the CLOCK signal transitions from high to low and its complement $\overline{\text{CLOCK}}$ transitions from low to high. These transitions switch the phases of phase 1 circuit 18 and phase 2 circuit 20; more particularly, $\overline{\text{CLOCK}}$ applies a high signal to the gate of discharge transistor $20_{DT}$ of phase 1 circuit 20 and CLOCK applies a low signal to the gate of precharge transistor $22_{PT}$ of phase 2 circuit 22. As a result of the high signal applied to the gate of discharge transistor $20_{DT}$ of phase 1 circuit 20, and assuming by way of example that the logic realized by logic circuit $20_L$ is true, then the fifth row of FIG. 2b illustrates that after a delay between t11 and t11.1, the output of first inverter $20_{INV1}$ begins to rise to a logic high. In other words, here the condition(s) associated with logic circuit $20_L$ is met and, thus, there is a conditional rising in the output of first inverter $20_{INV1}$. Further in response to this rising signal, and followed by a delay between t11.1 and t11.2, then the sixth row of FIG. 2b illustrates that the output of second inverter $20_{INV2}$ begins to fall to a logic low. Thus, also since the condition(s) associated with logic circuit $20_L$ is met, there is a conditional falling in the output of first inverter $20_{INV1}$.

At t12, the CLOCK signal transitions from low to high and its complement $\overline{\text{CLOCK}}$ transitions from high to low. As a result of the low signal applied to the gate of precharge transistor $20_{PT}$ of phase 1 circuit 20, then phase 1 circuit 20 unconditionally returns to the precharge phase; accordingly, after a delay between t12 and t12.1, the output of first inverter $20_{INV1}$ begins to unconditionally fall to a logic low. Further in response to this falling signal, and followed by a delay between t12.1 and t12.2, then the sixth row of FIG. 2b illustrates that the output of second inverter $20_{INV2}$ begins to unconditionally rise to a logic high. From the preceding, one skilled in the art will appreciate that the hold time, $t_h$, for the output of second inverter $20_{INV2}$, occurs between t12 and t12.2. This appreciation gives rise to two observations, a first concerning the operation during the hold time and a second concerning the operation following the hold time. Accordingly, each observation is separate addressed below.

With respect to the operation of phase 2 circuit 22 during the hold time of phase 1 circuit 20 (i.e., between t12 and t12.2), the high CLOCK signal places it in its evaluate phase due to the conduction of discharge transistor $22_{DT}$, as shown in the fourth row of FIG. 2b. At this time, therefore, the output of second inverter $20_{INV2}$ from circuit 20 serves as an input to logic circuit $22_L$; however, recall that this input to logic circuit $22_L$ is low because the example of FIG. 2b illustrates the instance where precharge node $20_{PN}$ was discharged in the immediately preceding evaluate phase. Moreover, because logic circuit $22_L$ is formed using one or more n-channel transistors, then this low output from the output of second inverter $20_{INV2}$ is disabling to logic circuit $22_L$ and, thus, logic circuit $22_L$, cannot realize a true equation in response to the output. As a result, a conductive path is not created between precharge node $22_{PN}$ and node $22_{N2}$. In other words, because logic circuit $22_L$ is disabled by the output of second inverter $20_{INV2}$, then the discharge path of phase 2 circuit 22 is disabled regardless of whether discharge transistor $22_{DT}$ or discharge prevention transistor $22_{DPT}$ is also concurrently conducting.

With respect to the operation of phase 2 circuit 22 after the hold time of phase 1 circuit 20 (i.e., after t12.2), a further understanding is now possible by examining the operation of discharge prevention transistor $22_{DPT}$ during that time and for the remainder of the evaluation phase of phase 2 circuit 22. In this regard, recall that the last row in FIG. 2b illustrates the gate control signal (i.e., $\text{CLOCK}_F$) to discharge prevention transistor $22_{DPT}$. At t12, $\text{CLOCK}_F$ is high and, thus, as of that time discharge prevention transistor $22_{DPT}$ is conducting. However, at t12.1, $\text{CLOCK}_F$ falls to a low level. As a result, discharge prevention transistor $22_{DPT}$ is disabled; at this time, therefore, discharge prevention transistor $22_{DPT}$ effectively opens or disables the discharge path of phase 2 circuit 22; further in this regard, recall at t12 the CLOCK signal rises and, following a delay between t12 and t12.2, the output of inverter $20_{INV2}$ unconditionally rises due to the operation of phase 1 circuit 20 precharging its precharge node $20_{PN}$, as shown in the sixth row of FIG. 2a. Note, therefore, that this unconditionally rising signal is a potentially enabling signal to logic circuit $22_L$; however, at this same time, since discharge prevention transistor $22_{DPT}$ disables the discharge path, then discharge prevention transistor $22_{DPT}$ thereby prevents any discharge from occurring despite the possible enabling of logic circuit $22_L$. It is for this reason that the terms "discharge prevention" are used in connection with discharge prevention transistor $22_{DPT}$.

Turning now to the signals of FIG. 2c, it illustrates the operation of system 18 in an instance where the discharge path of phase 1 circuit 20 is not enabled (i.e., is disabled) during its evaluate phase, thereby leaving the charge stored on precharge node $20_{PN}$. The reader is assumed familiar with the preceding discussion of FIG. 2b and, thus, the following detail is focused primarily on the differences between FIG. 2b and 2c.

Looking in FIG. 2c to the time after the steady-state operation at t10, phase 1 circuit 20 is in its precharge phase of operation while phase 2 circuit 22 is clocked such that it is permitted to be in its evaluate phase of operation. At t11, the CLOCK signal transitions and thereby switches phase 1 circuit 20 to its evaluate phase and phase 2 circuit 22 to its precharge phase. For the present example it is assumed that logic circuit $20_L$ does not realize a true equation, thereby supporting the premise of FIG. 2c that the discharge path of phase 1 circuit 20 is disabled. Accordingly, after t11, precharge node $20_{PN}$ is not discharged and, hence, the outputs of inverters $20_{INV1}$ and $20_{INV2}$ remain unchanged after t11 as shown.

At t12, the CLOCK signal transitions and thereby switches phase 1 circuit 20 to its precharge phase and phase 2 circuit 22 is permitted to evaluate. However, for the present example wherein the discharge path of phase 1 circuit 20 was disabled during its evaluate phase, then precharge node $20_{PN}$ maintained its charge and, thus, the outputs of inverters $20_{INV1}$ and $20_{INV2}$ remain unchanged after t12 as shown. Further in this regard, note that the output of inverter $20_{INV2}$ is high and thereby provides an enabling input to logic circuit $22_L$ (because logic circuit $22_L$ is formed using one or more n-channel transistors). Accordingly, assuming that logic circuit $22_L$ realizes a true equation in response to the enabling input, then after t12 precharge node $22_{PN}$ is connected to node $22_{N2}$. Moreover, also after t12, discharge transistor $22_{DT}$ is enabled by the high CLOCK and discharge prevention transistor $22_{DPT}$ is enabled by the high $CLOCK_F$ signal. As a result, the entire discharge path of phase 2 circuit 22 is enabled just after t12, and its precharge node $22_{PN}$ thereby discharges to ground (not shown in FIG. 2c). Finally, note at t12.1 that discharge prevention transistor $22_{DPT}$ is disabled by the low transition in the $CLOCK_F$ signal to thereby disable the discharge path of phase 2 circuit 22; however, by this point, the voltage at precharge node $22_{PN}$ already has been discharged as just described and, thus, the state of phase 2 circuit 22 has been properly changed as of this point in time. Stated alternatively, therefore, the illustration of FIG. 2c demonstrates that for a given evaluate phase for phase 2 circuit 22, it may only discharge at a time between t12 and t12.1, that is, after it begins its evaluate phase and no later than the falling transition of $CLOCK_F$.

Given the above, one skilled in the art should now appreciate that system 18 has the following attributes which may be contrasted as complementary to the prior art hold time latch described earlier in this document. Specifically with respect to system 18:

(1) The first stage of system 18 (i.e., phase 1 circuit 20) during its precharge phase outputs an unconditional high, whereas in the prior art non-inverting latch of FIG. 1a its first stage during its precharge operation outputs an unconditional low.

(2) The output of the first stage of system 18 (i.e., phase 1 circuit 20) conditionally falls only if the discharge path of the first stage is enabled during its evaluate phase, whereas in the prior art non-inverting latch of FIG. 1a its first stage output conditionally rises only if the discharge path of the first stage is enabled during its evaluate phase.

(3) The second stage of system 18 (i.e., phase 2 circuit 22) has a discharge path that may be enabled during its evaluate phase (and an output that correspondingly changes state in response thereto) only if the first stage output does not conditionally fall during the immediately preceding evaluate phase of the first stage, that is, only if the first stage output remains high and thereby enabling to the second stage. In other words, precharge node $22_{PN}$ may discharge in the evaluate phase of phase 2 circuit 22 only if precharge node $20_{PN}$ does not discharge in the immediately preceding evaluate phase of phase 1 circuit 20. To the contrary, therefore, if precharge node $20_{PN}$ does discharge for a given evaluate phase of phase 1 circuit 20, then precharge node $14_{PN}$ cannot discharge in the next successive evaluate phase of phase 2 circuit 14. The prior art inverting latch of FIG. 1a operates in a fashion that is complementary of the preceding two sentences. First, in the prior art inverting latch, its second stage may discharge in its evaluate phase only if the precharge node of its first stage discharges in the immediately preceding evaluate phase of phase 1 circuit 20. Second, in the prior art inverting latch, if the precharge node in its first stage does not discharge for a given evaluate phase of that stage, then the precharge node in the second stage cannot discharge in the next successive evaluate phase of the second stage.

(4) The output of the first stage of system 18 unconditionally rises for its next precharge phase, whereas in the prior art inverting latch the output of the first stage unconditionally falls for its next precharge phase. Note further with respect to system 18 that the effect of the rise to a high level will not cause phase 2 circuit 22 to discharge because, by the time the rising level reaches a sufficiently high value, discharge prevention transistor $22_{DPT}$ is already disabled and thereby prevents such a discharge.

The preceding demonstrates that system 18 provides an inverting hold time latch, as may be appreciated by further contrasting system 18 with the prior art in view of the state changes of system 18 versus that of the prior art. For system 18, the preceding demonstrates that if precharge node $20_{PN}$ does discharge for a given evaluate phase of phase 1 circuit 20, then precharge node $22_{PN}$ cannot discharge in the next successive evaluate phase of phase 2 circuit 22; thus, for system 18, its second stage cannot change state during its evaluate phase if its first stage changed state during its immediately preceding evaluate phase. The preceding further demonstrates that if precharge node $20_{PN}$ does not discharge for a given evaluate phase of phase 1 circuit 20, then precharge node $22_{PN}$ may discharge in the next successive evaluate phase of phase 2 circuit 22; thus, for system 18, its second stage can change state during its evaluate phase only if its first stage did not change state during its immediately preceding evaluate phase. One skilled in the art may readily discover that these state change limitations are complementary of those discussed above relative to system 10 of the prior art. Accordingly, system 18 operates as an inverting hold time latch which may be used in conjunction with a prior art non-inverting latch (as shown in FIG. 1a) to provide a complementary signal, where the combined inverting and non-inverting latches represent dual rail signals.

Figure 2D:
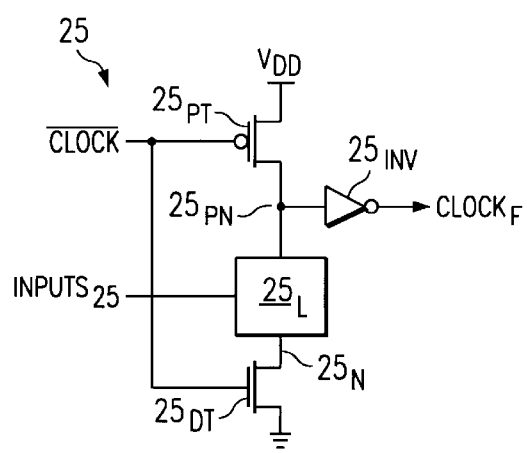
FIG. 2d illustrates a schematic of an embodiment for generating the $CLOCK_F$ signal shown in FIGS. 2a through 2c.

Having described the functionality and required timing with respect to $CLOCK_F$, note that it may be generated in various manners. FIG. 2d illustrates one example, where $CLOCK_F$ is produced by a domino gate 25 running off of $\overline{CLOCK}$. Specifically, domino gate 25 includes a p-channel precharge transistor $25_{PT}$ having a source connected to a source of the system voltage level (e.g., $V_{DD}$) and a drain connected to a precharge node $25_{PN}$. The gate of precharge transistor $25_{PT}$ is connected to receive $\overline{CLOCK}$, and is also connected to the gate of a discharge transistor $25_{DT}$. Further, domino gate 25 includes a discharge path from precharge node $25_{PN}$ to ground which includes a logic circuit $25_L$ and also discharge transistor $25_{DT}$. Discharge transistor $25_{DT}$ is an n-channel transistor having its source connected to a low reference voltage (e.g., ground) and its drain connected to a node $25_N$. Logic circuit $25_L$ is optionally included as discussed below, and may implement any type of logic equation and respond to one or more $INPUTS_{25}$. Finally, precharge node $25_{PN}$ is connected to the input of inverter $25_{INV}$, and the output of inverter $25_{INV}$ provides the $CLOCK_F$ signal.

The operation of gate 25 is understood by returning to the FIG. 2b, particularly its second and last rows. Before t11, $\overline{CLOCK}$ is low, thereby enabling precharge transistor $25_{PT}$ and disabling the discharge path of gate 25 by disabling discharge transistor $25_{DT}$. Accordingly, during this time precharge node $25_{PN}$ remains charged high and the output of inverter $25_{INV}$ is low.

At t11, $\overline{CLOCK}$ transitions high, thereby disabling precharge transistor $25_{PT}$ and enabling discharge transistor $25_{DT}$; it is further assumed at this time that $INPUTS_{25}$ will enable at least one conductive path through logic circuit $25_L$. Thus, the logic of logic circuit $25_L$ as well as the choice of the $INPUTS_{25}$ should be selected to satisfy this assumption; indeed, it may well be the case that gate 25 is a portion of a larger circuit and thus, these additional considerations may be purposefully taken advantage of to insert other considerations into the operation of the overall circuit and to control $CLOCK_F$ signal. In any event, provided this assumption is met, then following t11 the entire discharge path of gate 25 is enabled and, thus, $CLOCK_F$, as the output of inverter $25_{INV}$, rises to a high level. Further in this regard, note that the implementation of FIG. 2d will actually cause a delay between the transition of $\overline{CLOCK}$ at t11 and the rise in $CLOCK_F$, where the delay arises from the inversion created by precharge transistor $25_{PT}$ and the inversion created by inverter $25_{INV}$. However, this delay is not shown in FIG. 2b so as to simplify the illustration. Lastly, it should be noted that logic circuit $25_L$ is said to be optional because an alternative embodiment may be formed where it is removed and precharge node $25_{PN}$ is connected directly to node $25_N$, thereby eliminating the required choice of $INPUTS_{25}$ described above. For this alternative, one skilled in the art will readily confirm that the same output $CLOCK_F$ will be provided as described immediately above.

Completing the operation of gate 25, at t12 $\overline{CLOCK}$ transitions low, thereby commencing the precharge phase of operation for the gate. Once more, therefore, precharge transistor $25_{PT}$ is enabled and precharge node $25_{PN}$ is pulled toward $V_{DD}$. However, the delay caused by the switching of precharge transistor $25_{PT}$ along with the delay caused by the switching of inverter $25_{INV}$ causes the output of gate 25 to remain high for a short time, as shown in FIG. 2b between t12 and t12.1. This delay represents the hold time for gate 25, and it is preferably designed with sufficient time for phase 2 circuit 22 to evaluate, but also such that the hold time preferably ends so that $CLOCK_F$ falls before the output of second inverter $20_{INV2}$ unconditionally rises. Once this delay has passed, the output falls, as shown by $CLOCK_F$ following t12.1. Lastly, while $CLOCK_F$ has been shown in the preferred embodiment as being driven in response to the CLOCK signal, this is not required so long as the timing constraints otherwise discussed in this document are satisfied.

As an additional consideration, recall that in various instances above it is shown in the preferred embodiment that $CLOCK_F$ falls before the output of second inverter $20_{INV2}$ unconditionally rises. In practice, it is further noted in connection with the present embodiments that this relationship may not be absolutely required, that is, there may be some margin whereby $CLOCK_F$ may fall at the same time that the output of second inverter $20_{INV2}$ unconditionally rises or, indeed, there may be instances whereby $CLOCK_F$ may fall slightly after the time that the output of second inverter $20_{INV2}$ unconditionally rises. The amount of time by which this time constraint of $CLOCK_F$ relative to the rising output of inverter $20_{INV2}$ defines a pulse width during which time phase 2 circuit 22 is fully discharged (because during, that time all transistors in the path between precharge node $22_{PN}$ and ground are enabled). However, so long as this pulse width is relatively small, then the slight resulting discharge may be treated like any other source of electrical problem (e.g., charge sharing, charge injection, capacitive coupling to the output node, and so forth). Since one skilled in the art is now informed of this consequence, this knowledge will help plan for the margin which must be built into the signal delays to ensure correct operation.

As a final observation with respect to system 18 and its timing as shown in FIG. 2b, note that proper operation between circuits 20 and 22 also imposes a constraint on the pulse width of the CLOCK signal. Specifically, for a given evaluate phase of phase 1 circuit 20, if the output of second inverter $20_{INV2}$ is to fall to a low level, then this must occur before the evaluation phase is enabled in phase 2 circuit 22, that is, before CLOCK rises. Applying this requirement to the illustration of FIG. 2b, therefore, the action shown at t11.2 must precede the action shown at t12. If this does not occur, then there is the possibility that the output of second inverter $20_{INV2}$ would still be high when CLOCK rises, thereby permitting phase 2 circuit 22 to wrongfully discharge. Accordingly, this consideration also becomes a pulse width constraint on the CLOCK low phase.

Figure 3A:
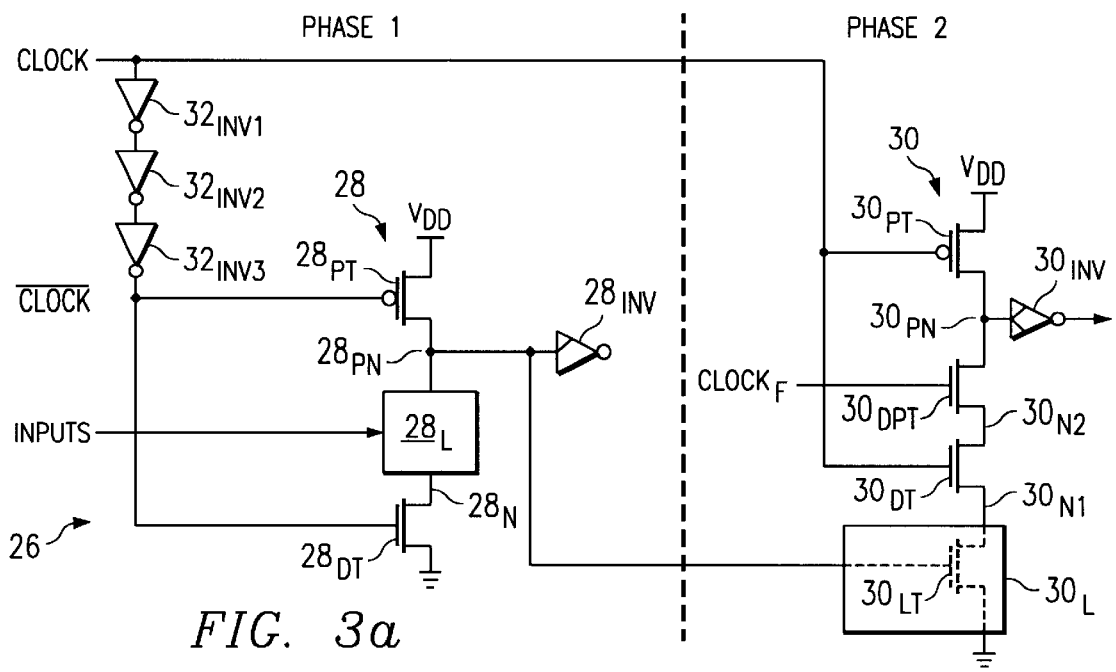
FIG. 3a illustrates a schematic of a second inventive inverting hold time latch embodiment including a first domino logic circuit where the precharge node of the domino logic circuit provides an input to a second domino logic circuit.

FIG. 3a illustrates a schematic of another inventive hold time latch system designated generally at 26. System 26 in certain respects resembles system 18 of FIG. 2, but for purposes of later discussion different reference numerals are used in FIG. 3a. However, due to the similarities the following discussion eliminates some of the detail provided above and the reader is assumed to be familiar with the earlier-discussed inventive embodiment. Turning to system 26, it includes a phase 1 circuit 28 to the left of a vertical dashed line and operating in one phase as well as a phase 2 circuit 30 to the right of the vertical dashed line and operating in a different phase. Phase 1 circuit 28 has a domino logic circuit stage including a precharge transistor $28_{PT}$, a precharge node $28_{PN}$, an output inverter $28_{INV}$, and a discharge path including both a logic circuit $28_L$ and a discharge transistor $28_{DT}$. Phase 2 circuit 30 also has a domino logic stage which includes a precharge transistor $30_{PT}$ a precharge node $30_{PN}$, an output inverter $30_{INV}$, and a discharge path including a discharge prevention transistor $30_{DPT}$, a discharge transistor $30_{DT}$ and a logic circuit $30_L$. The control signal $CLOCK_F$ introduced above is connected to the gate of discharge prevention transistor $30_{DPT}$. Further, and for reasons detailed below, logic circuit $30_L$ is shown as having a single transistor $30_{LT}$ (shown in phantom), while it should be understood that based on the logic to be implemented any number and arrangement of logic devices could be included in logic circuit $30_L$. Also in this regard, logic circuit $30_L$ may receive additional inputs from circuits other than phase 1 circuit 28, where in any event at least one discharge path may be created through logic circuit $30_L$ in response to the state(s) of its logic inputs.

System 26 also includes a conductor for providing a CLOCK signal, where the CLOCK signal is connected through three series inverters $32_{INV1}$, $32_{INV2}$, and $32_{INV3}$ such that its complement, $\overline{\text{CLOCK}}$, is connected to the gate of the gate of precharge transistor $28_{PT}$ and to the gate of discharge transistor $28_{DT}$. Additionally, and with respect to phase 2 circuit 30, the CLOCK signal is connected to the gate of precharge transistor $30_{PT}$ and to the gate of discharge transistor $30_{DT}$.

A more detailed description of the connections within phase 1 circuit 28 is as follows. Precharge transistor $28_{PT}$ is preferably a p-channel transistor and has a source connected to a source of the system voltage level (e.g., $V_{DD}$), a drain connected to precharge node $28_{PN}$ and, as noted above, the $\overline{\text{CLOCK}}$ signal connected to its gate. Discharge transistor $28_{DT}$ is preferably an n-channel transistor having its source connected to a low reference voltage (e.g., ground), its drain connected to a node $20_N$, and its gate connected to the $\overline{\text{CLOCK}}$ signal. Between precharge node $28_{PN}$ and a node $28_N$ is connected a logic circuit $28_L$, where its particular logic may implement any type of logic equation. The input(s) to logic circuit $28_L$ is generally shown as "INPUTS" in FIG. 3a, with it understood that such signals may come from various circuits, being static, dynamic, or both. In any event, once a logic equation formed by logic circuit $28_L$ is true, a conductive path is formed through logic circuit $28_L$ connecting precharge node $28_{PN}$ to node $28_N$. Further, recall that the $\overline{\text{CLOCK}}$ signal is connected to the gate of discharge transistor $28_{DT}$. Thus, when the CLOCK signal is low its complement is high and discharge transistor $28_{DT}$ is also conducting; if this conduction occurs while a logic equation implemented by logic circuit $28_L$ is true, then a discharge path is created from precharge node $28_{PN}$ to ground thereby discharging the voltage at precharge node $28_{PN}$. Further in this regard, note that precharge node $28_{PN}$ is connected as an input to an inverter $28_{INV}$. Inverter $28_{INV}$ has a short diagonal line in the upper half of the inverter symbol and, thus, by the convention described above, includes a p-channel transistor connected in a feedback manner from the output of the inverter to its input.

As a distinction between the embodiments of FIGS. 2a and 3a, note now how the output of phase 1 circuit 28 is connected as an input to phase 2 circuit 30. Particularly, in system 26 of FIG. 3a, the output from phase 1 circuit 28 is not taken from the output of an inverter, but instead it is provided by precharge node $28_{PN}$. Specifically, precharge node $28_{PN}$ as the output from phase 1 circuit 28 is connected as an input to logic circuit $30_L$ of phase 2 circuit 30. Further in this regard, recall from above that logic circuit $30_L$ includes at least one transistor $30_{LT}$. Transistor $30_{LT}$ is connected to receive at its gate the output from phase 1 circuit 28 (i.e., the voltage from precharge node $28_{PN}$). Looking now in more detail with respect to transistor $30_{LT}$, it preferably is located as the lowest connected transistor in the discharge path between precharge node $30_{PN}$ and ground, that is, transistor $30_{LT}$ has its source connected directly to ground. In addition, the drain of transistor $30_{LT}$ is connected to a node $30_{N1}$. Thus, logic circuit $30_L$ may include more than one transistor, but in any event the source of transistor $30_{LT}$ is preferably connected to ground for reasons detailed below.

Completing the remaining connections of phase 2 circuit 30, precharge transistor $30_{PT}$ is preferably a p-channel transistor with a source connected to a source of the system voltage level (e.g., $V_{DD}$), a drain connected to precharge node $30_{PN}$, and a gate connected directly to the CLOCK signal. The CLOCK signal is also connected to the gate of discharge transistor $30_{DT}$, which preferably is an n-channel transistor having its source connected to a node $30_{N1}$ and its drain connected to a node $30_{N2}$. Between precharge node $30_{PN}$ and node $30_{N1}$ is connected discharge prevention transistor $30_{DPT}$. More particularly and for reasons detailed below, in the preferred embodiment discharge prevention transistor $30_{DPT}$ is connected as the highest located transistor in the discharge path, that is, it has its drain connected directly to precharge node $30_{PN}$. Given the preceding connections, once a logic equation formed by logic circuit $30_L$ is true, a conductive path is formed through logic circuit $30_L$ and, thus, if both of discharge prevention transistor $30_{DPT}$ and discharge transistor $30_{DT}$ also are contemporaneously conducting, then the voltage at precharge node $30_{PN}$ is discharged through a path to ground. Accordingly, during the phase when CLOCK is high and thereby causes discharge transistor $30_{DT}$ to conduct, then precharge node $30_{PN}$ discharges only if signal $\text{CLOCK}_F$ is also high during that phase and logic circuit $30_L$ contemporaneously realizes a true equation. Lastly, precharge node $30_{PN}$ is connected as an input to inverter $30_{INV}$. Inverter $30_{INV}$ has a short diagonal line in both the upper half and lower half of the inverter symbol and, therefore, consistent with the convention described earlier it includes both a p-channel and n-channel feedback transistor so that once the precharge voltage is no longer connected to precharge node $30_{PN}$ the feedback p-channel transistor will maintain a high signal at the input of inverter $30_{INV}$ and if precharge node $30_{PN}$ is discharged then thereafter during the evaluate phase the feedback n-channel transistor will maintain a low signal at the input of inverter $30_{INV}$.

Figure 3B:
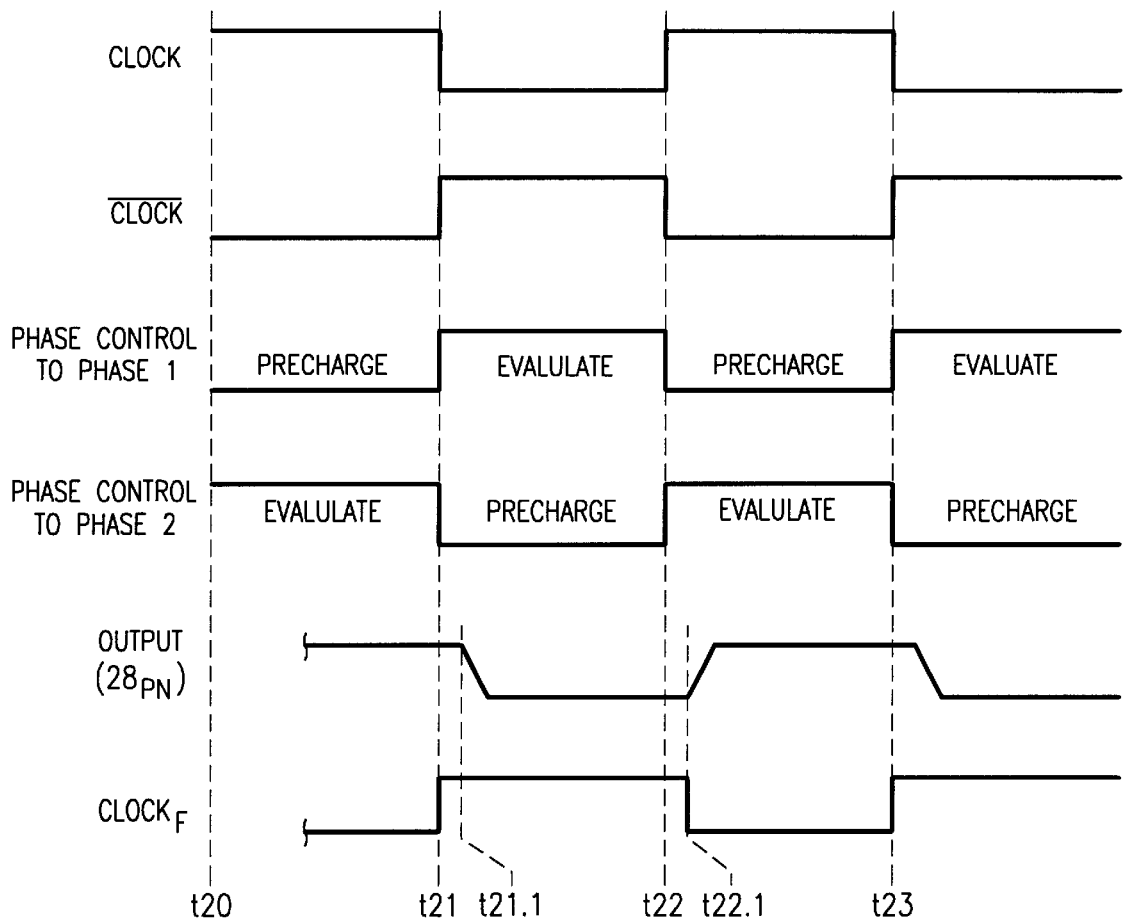
FIG. 3b illustrates a timing diagram demonstrating the operation of the circuits of FIG. 3a wherein the first domino logic circuit is discharged during its evaluate phase.

The operation of system 26 is comparable in certain respects to the timing diagram already described above and illustrated in FIG. 2b and, thus, the reader is referred to that discussion for additional detail. However, since phase 1 circuit 28 of system 26 uses precharge node $28_{PN}$ as its output, a comparable timing diagram is now shown and described in FIG. 3b, although the following is more summary in nature given the earlier detail provided with respect to FIG. 2b. Briefly reviewing the rows in FIG. 3b, the first four rows are the same as shown in FIG. 2b. The fifth row in FIG. 3b represents the output from phase 1 circuit 28 as connected as an input to phase 2 circuit 30, and recall that the output is from precharge node $28_{PN}$. The last row in FIG. 3b shows the $\text{CLOCK}_F$ signal which is tailored as described below so as to properly control discharge prevention transistor $30_{DPT}$.

The operation of system 26 is now explored in connection with the timing diagram of FIG. 3b, which illustrates an operational example where the discharge path of phase 1 circuit 28 is discharged and further depicts the results in view of that example Assume by a time t20 that system 26 is running at a steady-state and consider some time generally from the middle of t20 forward. Accordingly, phase 1 circuit 28 is in its precharge phase of operation while phase 2 circuit 30 is permitted to be in its evaluate phase of operation (i.e., its discharge transistor $30_{DT}$ is enabled). Accordingly, although not shown, phase 2 circuit 30 is therefore outputting data in response to its evaluation.

At t21, the CLOCK signal transitions from high to low and places phase 1 circuit 28 in its evaluate phase; assuming by way of example that the logic realized by logic circuit $28_L$ is true, then the fifth row of FIG. 3b illustrates that after a delay between t21 and t21.1, the output voltage taken from precharge node $28_{PN}$ begins to discharge; thus, during this evaluate phase, the voltage at precharge node $28_{PN}$ falls to a logic low level. As an aside, if the present example were changed such that the logic realized by logic circuit $28_L$ is false, then note that the p-channel feedback transistor connected to the output of inverter $28_{INV}$ would serve to maintain a high voltage at precharge node $28_{PN}$. The remaining discussion focuses on the prior example, however, where the logic is true and, hence, there is a conditional falling in the output of phase 1 circuit 28 as represented by the voltage at precharge node $28_{PN}$.

At t22, the CLOCK signal transitions from low to high and as a result phase 1 circuit 28 returns to the precharge phase while phase 2 circuit 30 is permitted to be in its evaluate because the high CLOCK enables discharge transistor $30_{DT}$. Also at this time, $CLOCK_F$ is still high and, thus, discharge prevention transistor $30_{DPT}$ is also enabled; however, further at this time precharge node $28_{PN}$ provides an input to logic circuit $30_L$, and recall that this input to logic circuit 30, is low because the example of FIG. 3b illustrates the instance where precharge node $28_{PN}$ was discharged in the immediately preceding evaluate phase. Moreover, because logic circuit $30_L$ is formed using one or more n-channel transistors, then this low output from precharge node $28_{PN}$ is disabling to logic circuit $30_L$ and, thus, logic circuit $30_L$ cannot realize a true equation. As a result, a conductive path is not created between precharge node $30_{PN}$ and ground. In other words, because logic circuit $30_L$ is disabled by the voltage at precharge node $28_{PN}$, then the discharge path of phase 2 circuit 30 is disabled regardless of whether discharge transistor $30_{DT}$ or discharge prevention transistor $30_{DPT}$ is also concurrently conducting. Further in this regard, recall that three series inverters $30_{INV1}$, $30_{INV2}$, and $30_{INV3}$ are connected between CLOCK and the gate of precharge transistor $28_{PT}$. Thus, although CLOCK transitions from low to high at t22, there will be at least this three inverter delay before precharge node $28_{PN}$ can rise and, thus, during this delay there is no possibility of an erroneous rise in precharge node $28_{PN}$ and a consequential discharge of phase 2 circuit 30.

At t22.1, $CLOCK_F$ falls to a low level and thereby disables discharge prevention transistor $30_{DPT}$. At this time, therefore, discharge prevention transistor $30_{DPT}$ effectively opens or disables the discharge path of phase 2 circuit 30; further in this regard, recall at t22 the CLOCK signal rises and, following a delay between t22 and t22.1, precharge node $28_{PN}$, as the output of phase1 circuit 28, unconditionally rises. This unconditionally rising signal is a potentially enabling signal to logic circuit $30_L$; however, at this same time, since discharge prevention transistor $30_{DPT}$ disables the discharge path of phase 2 circuit 30, then discharge prevention transistor $30_{DPT}$ thereby prevents any discharge from occurring despite the possible enabling of logic circuit $30_L$. Once more, therefore, proper operation is ensured in the second stage notwithstanding the unconditional rise in the output of the first stage.

Figure 3C:
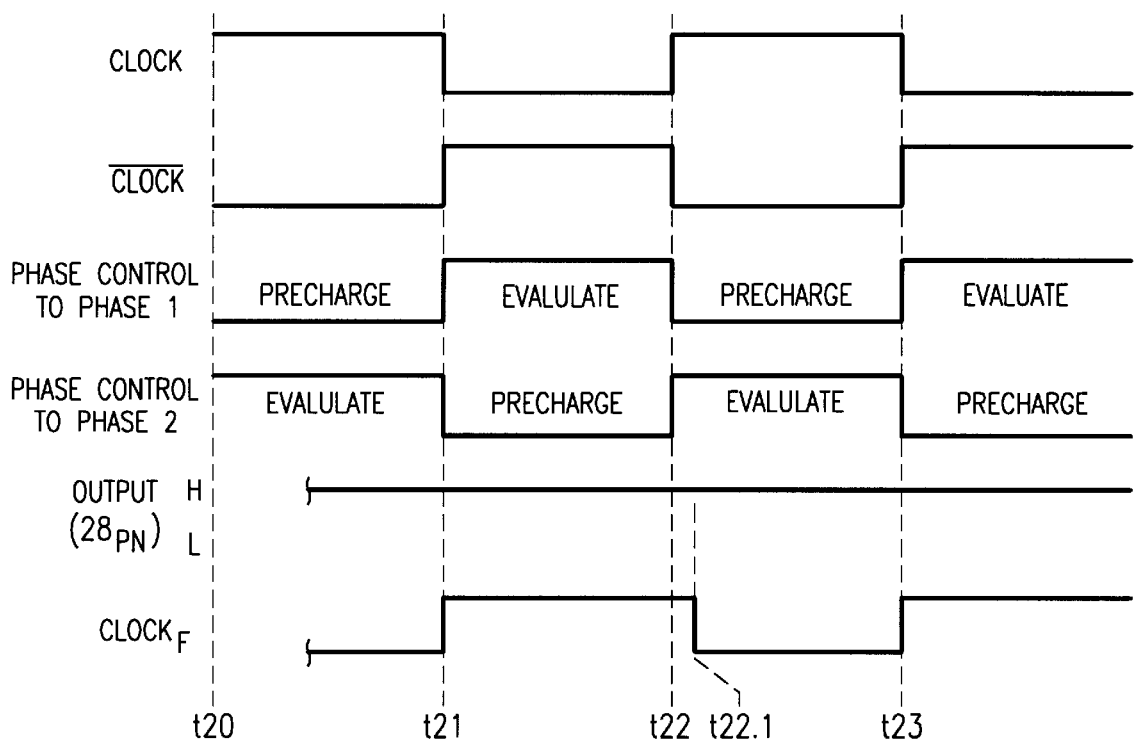
FIG. 3c illustrates a timing diagram demonstrating the operation of the circuits of FIG. 3a wherein the first domino logic circuit is not discharged during its evaluate phase.

Given the preceding descriptions and illustrations, a brief discussion is now provided in connection with FIG. 3c which illustrates the operational example of inverting hold time latch system 26 where the discharge path of phase 1 circuit 28 is not enabled during its evaluate phase. Accordingly, the following confirms what should be the expected operation of a system that is complementary of a non-inverting system and, thus, it is shown below that the enabling of the discharge path of phase 1 circuit 28 prevents the enabling of the discharge phase of phase 2 circuit 30.

After the steady-state time represented by t20 and before t21, CLOCK is high thereby placing phase 1 circuit 28 in its precharge phase of operation and permitting phase 2 circuit 30 to be in its evaluate phase of operation. Thus, as shown in the fifth row of FIG. 3c the output of phase 1 circuit 28 (i.e., precharge node $28_{PN}$) is high. At t21, CLOCK transitions low and thereby switches phase 1 circuit 28 to its evaluate phase and phase 2 circuit 30 to its precharge phase. For the present example it is assumed that logic circuit $28_L$ does not realize a true equation in support of the premise that that the discharge path of phase 1 circuit 28 is not enabled. Accordingly, after t21, precharge node $28_{PN}$ is not discharged and, thus, it remains high as shown. Also note that $CLOCK_F$ transitions high at t21, thereby enabling discharge prevention transistor $30_{DPT}$.

At t22, CLOCK transitions high and thereby switches phase 1 circuit 28 to its precharge phase and phase 2 circuit 30 is permitted to be in its evaluate phase. However, because the discharge path of phase 1 circuit 28 was disabled during its preceding evaluate phase, then precharge node $28_{PN}$ maintained its high charge and thereby provides an enabling input to logic circuit $30_L$. Accordingly, assuming that logic circuit $30_L$ realizes a true equation in response to the enabling input, then after t22 node $30_{N1}$ is connected through logic circuit $30_L$ to ground. Moreover, also after t22, discharge transistor $28_{DT}$ is enabled by the high CLOCK and discharge prevention transistor $28_{DPT}$ is enabled by the high $CLOCK_F$ signal. As a result, the entire discharge path of phase 2 circuit 30 is enabled just after t22, and its precharge node $30_{PN}$ thereby discharges from its high voltage to ground. Finally, note at t22.1 discharge prevention transistor $30_{DPT}$ is disabled by the low transition in the $CLOCK_F$ signal to thereby disable the discharge path of phase 2 circuit 30; however, by this point, the voltage at precharge node $30_{PN}$ already has been discharged as just described and, thus, the state of phase 2 circuit 30 has been properly changed as of this point in time.

Given the above, one skilled in the art should now appreciate that system 26 of FIG. 3a also provides an inverting hold time latch in that it has the same four operating attributes set forth above with respect to system 18 of FIG. 2a; however, a primary distinction arises between the embodiments given the use of a different node as the output from the first stage to the second stage of the circuit. In addition, note with respect to system 26 that the use of precharge node $28_{PN}$ as the first stage output eliminates two inverter delays that arise in system 18 from inverters $20_{INV1}$ and $20_{INV2}$. Accordingly, the operational speed of phase 1 circuit 28 is faster than that of phase 1 circuit 20, which therefore translates into a faster overall operational speed for system 26 as compared to system 18.

An additional observation arises with respect to system 26 by recalling that the output of phase 1 circuit 28 preferably passes to the gate of the transistor connected in the lowest portion of the discharge path of phase 2 circuit 30, that is, to the transistor having its source connected to ground (i.e., transistor $30_{LT}$). This type of connection is preferred in that it helps avoid charge sharing problems which might otherwise arise when phase 1 circuit 28 is precharged if a different transistor were driven by the output of phase 1 circuit 28. More particularly, in the preferred embodiment, when phase 1 circuit 28 is in its evaluate phase and its logic circuit $28_L$ does not conduct, it outputs a high voltage of $V_{DD}$ which is effectively held via capacitance at $V_{DD}$. This $V_{DD}$ voltage is connected to the gate of transistor $30_{LT}$ while the source of transistor $30_{LT}$ is connected to ground; thus, the gate-to-source voltage of transistor $30_{LT}$ equals $V_{DD}$ and, thus, transistor $30_{LT}$ is fully enabled. Next, therefore, when phase 2 circuit 30 enters its evaluate phase, and if the other transistors in its discharge path are enabled while transistor $30_{LT}$ was already fully enabled from the preceding evaluate phase of phase 1 circuit 28, then there is no charge sharing requirement from the output of phase 1 circuit 28; however, if the precharge node $28_{PN}$ were used as an output to the gate of a transistor higher in the discharge path of phase 2 circuit 30, when phase 2 circuit 30 began evaluating this higher-located transistor would require some charge to turn on its channel because the source of this higher-located transistor would have been floating at a potential higher than ground. This requirement is therefore avoided by locating transistor $30_{LT}$ as the lowest-connected transistor in the discharge path of phase 2 circuit 30.

A final observation arises with respect to system 26 by recalling that the $CLOCK_F$ signal is connected to the gate of the transistor connected in the highest portion of the discharge path of phase 2 circuit 30, that is, to the transistor having its drain connected to precharge node $30_{PN}$ (i.e., transistor $30_{DPT}$). Specifically, this transistor will be on during the precharge phase of operation of phase 2 circuit 30 (as shown in FIG. 3b between t21 and t22). As a result, the drain of discharge prevention transistor $30_{DT}$ will be pre-charged at will not contribute to charge sharing.

Figure 3D:
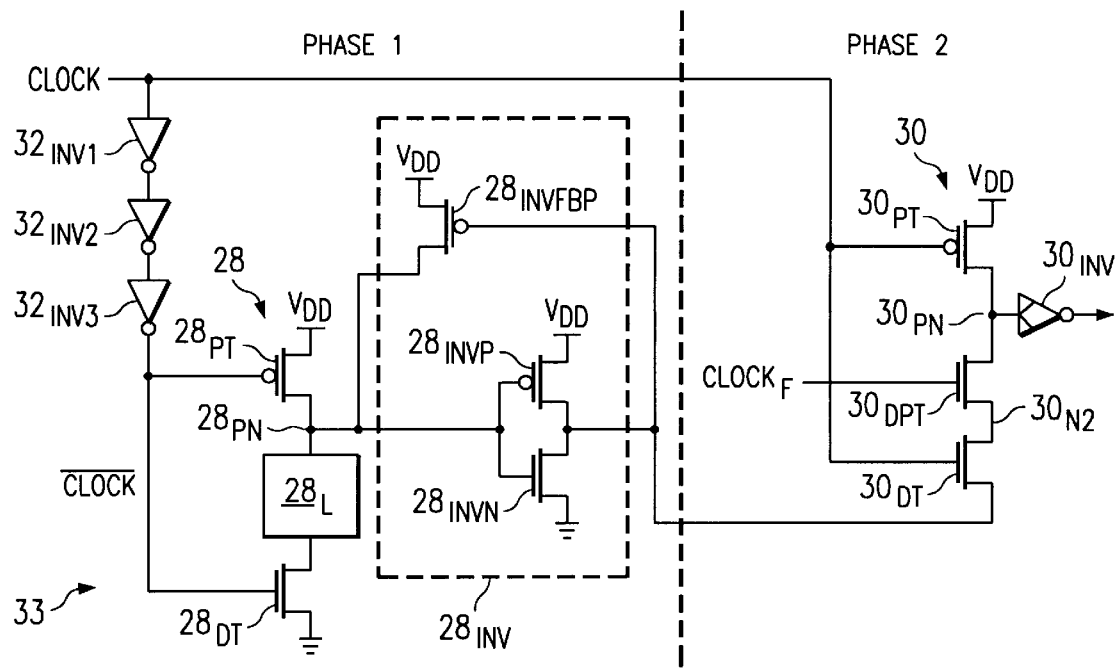
FIG. 3d illustrates a schematic of a third inventive inverting hold time latch embodiment including a first domino logic circuit where an inverter connected to the precharge node of the domino logic circuit provides an input to a second domino logic circuit by connecting to a source of the discharge transistor in the second domino logic circuit.

FIG. 3d illustrates a schematic of another inventive hold time latch system designated generally at 33, and which shares many common aspects with inventive hold time latch system 26 of FIG. 3a; for this reason, where like items are used in FIGS. 3a and 3d, like reference numerals are also used. Accordingly, the following discussion focuses on the differences between systems 26 and 33 and, thus, the reader is referred to the earlier discussion for additional details concerning devices, connections, and operation for items common to both systems 26 and 33.

Turning now to the differences between systems 26 and 33, note that precharge node $28_{PN}$ of phase 1 circuit 28 is not directly connected to phase 2 circuit 30. Instead, the output of inverter $28_{INV}$ is connected to phase 2 circuit 30 and, more particularly, to the source of discharge transistor $30_{DT}$. Thus, the output of phase 1 circuit 28 is an inversion of the precharge voltage at precharge node $28_{PN}$. However, note further that phase 2 circuit 30 does not include the single transistor $30_{LT}$ shown in FIG. 3a. As will be demonstrated below, however, the different connections of system 33 effectively permit an n-channel transistor $28_{INVN}$ in phase 1 circuit 28 (i.e., of inverter $28_{INV}$) to perform a portion of the operational effect of single transistor $30_{LT}$. Lastly, it is noted that FIG. 3d illustrates the schematic details of inverter $28_{INV}$ which were not shown in FIG. 3a. These details include both n-channel transistor $28_{INVN}$ and a p-channel transistor $28_{INVP}$ having their gates connected to one another as the input of inverter $28_{INV}$, and having their drains connected to one another as the output of inverter $28_{INV}$. Further, the source of n-channel transistor $28_{INVN}$ is connected to $V_{DD}$ while the source of p-channel transistor $28_{INVP}$ is connected to ground. In addition, the schematic illustration of FIG. 3d shows the p-channel feedback transistor $28_{INVFBP}$ which is represented by the upper diagonal line in the inverter symbol in FIG. 3a and, as discussed earlier, its gate is connected to the output of the inverter $28_{INV}$, its source is connected to $V_{DD}$, and its drain is connected to the input of inverter $28_{INV}$.

Having earlier discussed the operation of system 26 using the timing diagrams of FIGS. 3b and 3c, the comparable operation of system 33 may be appreciated without an additional timing diagram. In general, once more an inverting hold time latch functionality is provided with phase 1 circuit 28 and phase 2 circuit 30 alternating between precharge and evaluate phases and out of phase with respect to one another. However, the state of the output of phase 1 circuit 28 in system 33 is different due to the use of the output of inverter $28_{INV}$ to drive phase 2 circuit 30. Specifically, in its precharge phase, phase 1 circuit 28 once more precharges its precharge node $28_{PN}$ to $V_{DD}$, but this signal is inverted and output to phase 2 circuit 30; thus, the output of the first stage of system 33 is unconditionally low in response to its precharge phase. However, as demonstrated below, an inverting latch functionality is still provided because the second stage of system 33 will change state in its evaluate phase only if the first stage of system 33 did not change state during its immediately preceding evaluate phase. This functionality is confirmed below by tracing the operation of system 33 first in the instance where its first stage changes state and second in the instance where its first stage does not change state.

As a first example, assume that phase 1 circuit 28 of system 33 changes state during its evaluate phase, that is, its precharge node $28_{PN}$ is discharged by enabling its discharge path. Consequently, precharge node $28_{PN}$ falls to a low value, and this low value is inverted by inverter $28_{INV}$ so that a high voltage is connected to the source of discharge transistor $30_{DT}$. Next, CLOCK transitions high and phase 2 circuit 30 of system 33 enters its evaluate phase, and at the beginning of that evaluate phase $CLOCK_F$ is asserted in the same manner as shown in FIG. 3b. During this time, therefore, discharge prevention transistor $30_{DPT}$ is enabled. However, recall that the high voltage from the output of inverter $28_{INV}$ is connected to the source of discharge transistor $30_{DT}$ which, therefore, has $V_{DD}$ connected to both its source and drain. As a result, discharge transistor $30_{DT}$ does not conduct and, therefore, the precharge voltage at precharge node $30_{PN}$ does not change. In view of the preceding, one skilled in the art will recognize that the state of phase 2 circuit 30 cannot change during its evaluate phase when the state of phase 1 circuit 28 changes during its immediately preceding evaluate phase. This is consistent with the operation of the other inverting hold time latch embodiments described above.

As a second operational example of system 33, assume that the state of phase 1 circuit 28 does not change during its evaluate phase, that is, its precharge node $28_{PN}$ is not discharged because the discharge path of phase 1 circuit 28 is not enabled. Consequently, precharge node $28_{PN}$ remains at a high value (as further maintained by p-channel feedback transistor $28_{INVFBP}$), and the high value is inverted by inverter $28_{INV}$ so that a low voltage is connected to the source of discharge transistor $30_{DT}$. Next, CLOCK transitions high thereby permitting phase 2 circuit 30 of system 33 to be in its evaluate phase, and at the beginning of that evaluate phase $CLOCK_F$ is asserted in the same manner as shown in FIG. 3b. During this time, therefore, discharge prevention transistor $30_{DPT}$ is enabled. Moreover, recall that the low voltage from the output of inverter $28_{INV}$ is connected to the source of discharge transistor $30_{DT}$ which, therefore, has a gate-to-source voltage sufficiently high so as to enable it; another way of viewing this same operation is noting that the state of phase 1 circuit 28 is such that its output inverter n-channel transistor $28_{INVN}$ is enabled, and that operation completes the enabling of the discharge path of phase 2 circuit 30 by noting that n-channel transistor $28_{INVN}$ is effectively in that discharge path. In any event, this operation is such that the precharge voltage at precharge node $30_{PN}$ changes. Accordingly, the state of phase 2 circuit 30 changes during its evaluate phase when the stage of phase 1 circuit 28 does not change during its immediately preceding evaluate phase. Once more, therefore, this is consistent with the operation of the other inverting hold time latch embodiments described above.

Additional observations are noteworthy in contrasting system 33 of FIG. 3d with system 26 of FIG. 3a. Particularly, upon close review of the schematics, it should be appreciated that system 33 provides the inverting latch functionality with one less transistor than system 26. In addition, it is noted that system 26, by using a precharge node of the first stage to directly drive the second stage, gives rise to additional considerations in that it is preferable that the two stages be located relatively close to one another so as not to additionally burden the load on precharge node $28_{PN}$ in system 26; alternatively, however, since the first stage in system 33 uses the output of an inverter (i.e., inverter $28_{INV}$) to drive the second stage rather than a precharge node, then the output is more robust and may be located farther from the second stage and, indeed, also may be used to drive numerous stages. Still further, charge sharing issues arise when discharge transistor $30_{DT}$ is enabled in system 26 with respect to node $30_{N1}$ whereas in system 33 there is no such issue because when its discharge transistor $30_{DT}$ is enabled p-channel transistor $28_{INVP}$ connects $V_{DD}$ to the source of that transistor while its discharge prevention transistor $30_{DPT}$ also connects $V_{DD}$ to the drain of that transistor.

Figure 4A:
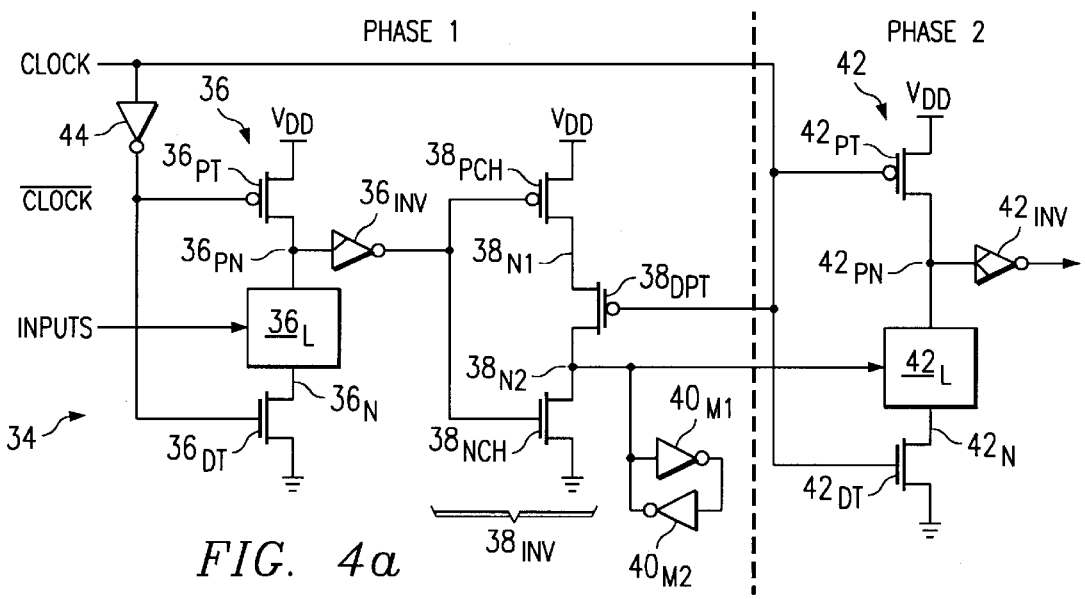
FIG. 4a illustrates a schematic of an inventive inverting hold time latch embodiment including a first domino logic circuit with a first and second output inverter, where the second output inverter provides an input to a second domino logic circuit and where the second output inverter includes a discharge prevention transistor to prevent the second domino logic circuit from wrongfully discharging when the first stage begins to precharge.

FIG. 4a illustrates a schematic of another inventive hold time latch system designated generally at 34. System 34 in certain respects resembles system 18 of FIG. 2a, but again for purposes of later discussion different reference numerals are used in FIG. 4a, with it nonetheless assumed that the reader is familiar with the earlier-discussed inventive embodiments. Turning to system 34, it includes a phase 1 circuit 36 to the left of a vertical dashed line and operating in one phase and a phase 2 circuit 42 to the right of the vertical dashed line and operating in a different phase. Phase 1 circuit 36 has a domino logic circuit stage including a precharge transistor $36_{PT}$, a precharge node $36_{PN}$, a first output inverter $36_{INV}$, and a discharge path including both a logic circuit $36_L$ and a discharge transistor $36_{DT}$. For reasons detailed below, phase 1 circuit 36 also includes a second output inverter $38_{INV}$. Phase 2 circuit 42 also has a domino logic stage which includes a precharge transistor $42_{PT}$, a precharge node $42_{PN}$, an output inverter $42_{INV}$, and a discharge path including a logic circuit $42_L$ and a discharge transistor $42_{DT}$. Lastly, the output of phase 1 circuit 36 is taken from inverter $38_{INV}$ and is connected as an input to logic circuit $42_L$. Both logic circuits $36_L$ and $42_L$ may receive additional inputs, and may be configured to realize various logic equations.

System 34 also includes a conductor for providing a CLOCK signal, where the CLOCK signal is connected through an inverter 44 such that its complement, $\overline{CLOCK}$, is connected to the gate of precharge transistor $36_{PT}$ and to the gate of discharge transistor $36_{DT}$. Additionally, and with respect to phase 2 circuit 42, the CLOCK signal is connected to the gate of precharge transistor $42_{PT}$ and to the gate of discharge transistor $42_{DT}$.

A more detailed description of the connections within phase 1 circuit 36 is as follows. Precharge transistor $36_{PT}$ is preferably a p-channel transistor and has a source connected to a source of the system voltage level (e.g., $V_{DD}$), a drain connected to precharge node $36_{PN}$ and, as noted above, the $\overline{CLOCK}$ signal connected to its gate. Discharge transistor $36_{DT}$ is preferably an n-channel transistor having its source connected to a low reference voltage (e.g., ground), its drain connected to a node $36_N$, and its gate connected to the $\overline{CLOCK}$ signal. Between precharge node $36_{PN}$ and a node $36_N$ is connected logic circuit $36_L$, and when a logic equation formed by logic circuit $36_L$ is true and the $\overline{CLOCK}$ signal is high, a conductive discharge path is formed from precharge node $36_{PN}$, through logic circuit $36_L$ and discharge transistor $36_{DT}$, to ground, thereby discharging the voltage at precharge node $36_{PN}$. Further in this regard, since precharge node $36_{PN}$ is connected as an input to output inverter $36_{INV}$, then the discharged signal is inverted once at the output of inverter $36_{INV}$. As detailed below, this signal is further modified by second inverter $38_{INV}$. Lastly, note that first output inverter $36_{INV}$ has a short diagonal line in the upper half of the inverter symbol and, thus, it includes a p-channel transistor connected in the above-described feedback manner from the output of the inverter to its input.

Looking to phase 2 circuit 42, it in various respects includes components comparable to those shown in the second stage circuit of FIG. 1a. In this regard, phase 2 circuit 42 includes a domino logic stage having a precharge transistor $42_{PT}$, a precharge node $42_{PN}$, an output inverter $42_{INV}$, and a discharge path including both a logic circuit $42_L$ and a discharge transistor $42_{DT}$. More particularly, precharge transistor $42_{PT}$ is preferably a p-channel transistor with a source connected to the system voltage level (e.g., $V_{DD}$), a drain connected to precharge node $42_{PN}$, and a gate connected to the CLOCK signal. Discharge transistor $42_{DT}$ is preferably an n-channel transistor having its source connected to a low reference voltage (e.g., ground), its drain connected to a node $42_N$, and its gate connected to the CLOCK signal. Logic circuit $42_L$ is connected between precharge node $42_{PN}$ and a node $42_N$. Lastly, precharge node $42_{PN}$ is further connected to the input of output inverter $42_{INV}$, which, as represented by short diagonal lines in both the upper half and lower half of the inverter symbol, is connected to both a p-channel and n-channel feedback transistor.

As a distinction between the embodiments of FIGS. 2a and 4a, attention is now directed in detail to second output inverter $38_{INV}$ of phase 1 circuit 36 as well as its connections to phase 2 circuit 42. Specifically, output inverter $38_{INV}$ includes a p-channel transistor $38_{PCH}$ having its source connected to $V_{DD}$, its gate connected to the output of first inverter $36_{INV}$, and its drain connected to a node $38_{N1}$. Output inverter $38_{INV}$ further includes an n-channel transistor $38_{NCH}$ having its source connected to ground, its gate connected to the output of first inverter $36_{INV}$, and its drain connected to a node $38_{N2}$. Between nodes $38_{N1}$ and $38_{N2}$ is connected the channel of a discharge prevention transistor $38_{DPT}$, which in the preferred embodiment is a p-channel transistor. As further explored below, the terms "discharge prevention transistor" are again used with the present embodiment because transistor $38_{DPT}$, although included as part of phase 1 circuit 36, operates in a manner to prevent wrongful discharge of phase 2 circuit 42. The gate of discharge prevention transistor $38_{DTP}$ is connected to receive the same CLOCK signal that controls phase 2 circuit 42. Lastly, two inverters $40_{M1}$ and $40_{M2}$ are connected in a feedback loop to maintain a voltage at node $38_{N2}$, that is, the input of inverter $40_{M1}$ is connected to node $38_{N2}$ and the output of inverter $40_{M1}$ is connected to the input of inverter $40_{M2}$, while the output of inverter $40_{M2}$ is also connected to node $38_{N2}$.

Figure 4B:
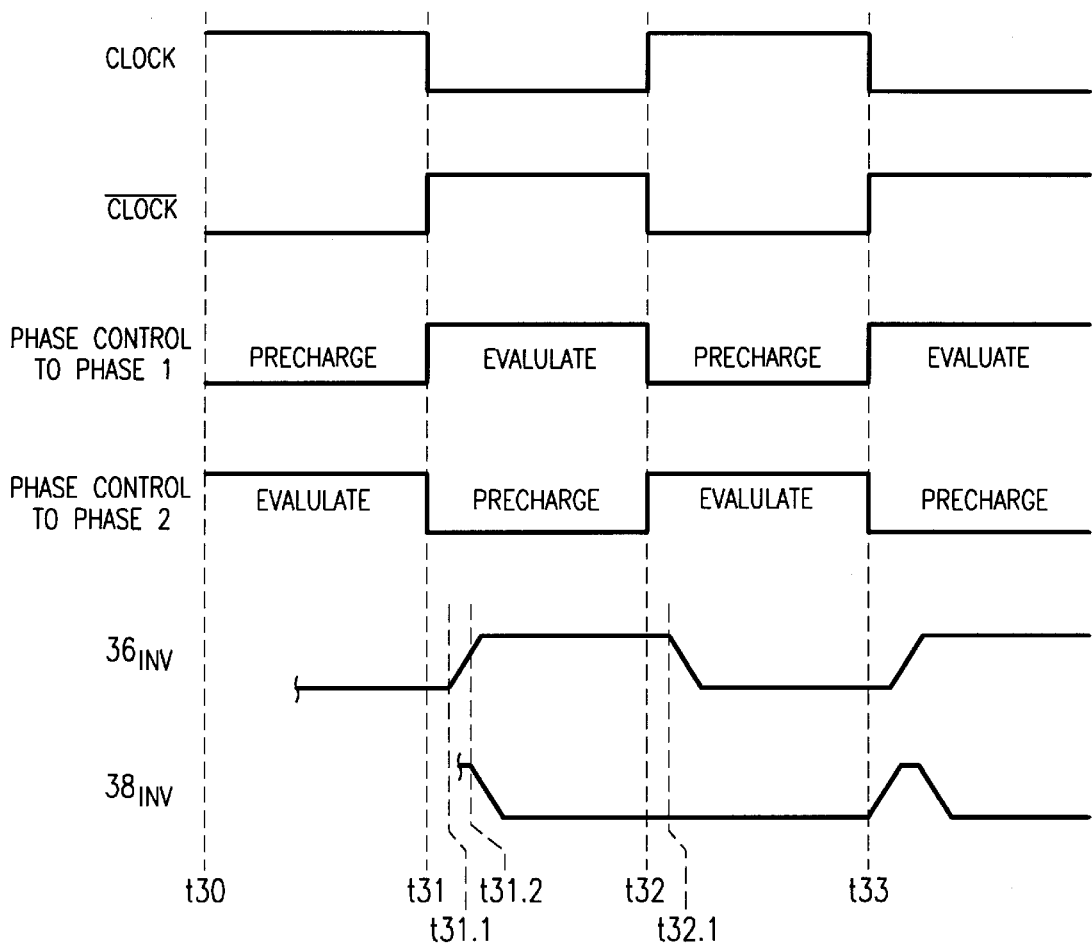
FIG. 4b illustrates a timing diagram demonstrating the operation of the circuits of FIG. 4a wherein the first domino logic circuit is discharged during its evaluate phase.
Figure 4C:
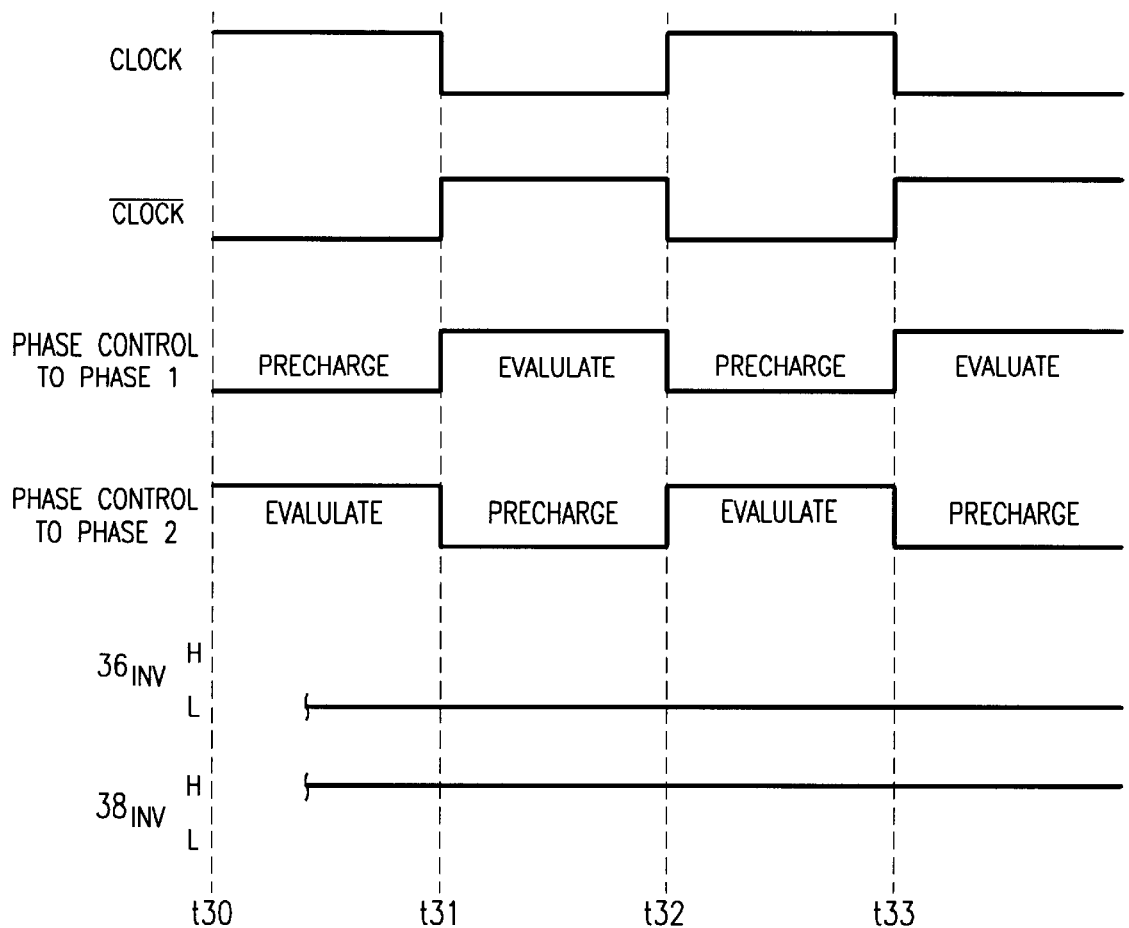
FIG. 4c illustrates a timing diagram demonstrating the operation of the circuits of FIG. 4a wherein the first domino logic circuit is not discharged during its evaluate phase.

The operation of system 34 is comparable in certain respects to the that illustrated by the timing diagrams described above and shown in FIGS. 2b and 3b, and is described now using FIGS. 4b and 4c, where both of these latter Figures share the same first four rows of FIGS. 2b and 3b. Introducing the last two rows of FIGS. 4b and 4c, the fifth row illustrates the output of first inverter $36_{INV}$ of phase 1 circuit 36, and the sixth row illustrates the output of second inverter $38_{INV}$ of phase 1 circuit 36. Note that no separate $CLOCK_F$ signal is required for system 34 and, hence, no such signal is shown in FIG. 4b. The reasons for this omission as well as various other operational aspects will be apparent from the remaining discussion. Finally, as with other embodiments described earlier, the operation of system 34 is now explored for two different instances, where the first instance is shown in FIG. 4b and represents an operational example where the discharge path of phase 1 circuit 36 is enabled and the second instance is shown in FIG. 4c and represents an operational example where the discharge path of phase 1 circuit 36 is not enabled.

Looking now to the operation of system 34 where the discharge path of phase 1 circuit 36 is enabled as shown in the timing diagram of FIG. 4b, assume by a time t30 that system 34 is running at a steady-state and consider some time generally from the middle of t30 forward. Here, phase 1 circuit 36 is in its precharge phase of operation while phase 2 circuit 42 is permitted to be in its evaluate phase of operation. Accordingly, although not shown, phase 2 circuit 42 is therefore outputting data in response to its evaluation.

At t31, the CLOCK signal transitions from high to low and thereby places phase 1 circuit 36 in its evaluate phase and phase 2 circuit 42 in its precharge phase. Looking to the former, and assuming by way of example that the logic realized by logic circuit $36_L$ is true to support the present example wherein the discharge path of phase 1 circuit 36 is enabled, then the fifth row of FIG. 4b illustrates that after a delay between t31 and t31.1, the output of first inverter $36_{INV}$ begins to rise to a logic high in response to the discharge of the voltage at precharge node $36_{PN}$. In addition, this rising signal from first inverter $36_{INV}$ is input to second inverter $38_{INV}$ and, thus, after a delay between t31.1 and t31.2, the output of second inverter $38_{INV}$ begins to fall to a logic low. Lastly, it is noted that the signal for the output of second inverter $38_{INV}$ is generally not shown before t31.1 in FIG. 4b so as to simplify the illustration, while one skilled in the art will readily appreciate its behavior given the later discussion of that signal both prior to and after t33.

At t32, the CLOCK signal transitions from low to high. This transition places phase 1 circuit 36 in its precharge phase and, after some delay between t32 and t32.1, precharge node $36_{PN}$ begins to precharge and the output from inverter $36_{INV}$ begins to rise as shown in the fifth row of FIG. 4b. The t32 CLOCK transition also permits phase 2 circuit 42 to be in its evaluate phase. However, at this same time, the high CLOCK signal is connected to the gate of discharge prevention transistor $38_{DPT}$ in phase 1 circuit 36. Thus, discharge prevention transistor $38_{DPT}$ is disabled and, as a result, even though the input to inverter 38 (i.e., as output by inverter $36_{INV}$) is falling, the disabling of discharge prevention transistor $38_{DPT}$ prevents inverter $38_{INV}$ from outputting a high signal; stated alternatively, once the output of phase 1 circuit 36 conditionally falls low during an evaluate phase of phase 1 circuit 36, then unlike the FIG. 2a embodiment the FIG. 4a embodiment does not provide an unconditionally rising signal shortly after the rising CLOCK transition. Instead, the disabling of discharge prevention transistor $38_{DPT}$ delays the unconditional rising until t33 as described below. In effect, therefore, the inverting function of inverter $38_{INV}$ is disabled during this time.

At t33, the CLOCK signal transitions from high to low. This transition once again places phase 1 circuit 36 in its evaluate phase and phase 2 circuit 42 in its precharge phase. In addition, this transition enables discharge prevention transistor $38_{DPT}$ and thereby enables the inverting function of inverter $38_{INV}$. Thus, shortly after t33 inverter $38_{INV}$ once again inverts the output of inverter $36_{INV}$, and thus, after t33 the last two rows in FIG. 4b are complementary (with the fifth row low and the sixth row high for an example where it is assumed that phase 1 circuit 36 is again discharged by during its evaluation phase after t33). Moreover, as of t33, it should be appreciated that the preceding operation of discharge prevention transistor $38_{DPT}$, in instances where a conditional discharge has occurred in phase 1 circuit 36, prevents a rise in the output signal from inverter $38_{INV}$ during the entire following evaluate phase of phase 2 circuit 42. In this manner, therefore, discharge prevention transistor $38_{DPT}$ prevents a wrongful discharge of phase 2 circuit 42 and, thus, once again the terms "discharge prevention transistor" are appropriate for the transistor given its functionality.

Looking now to the operation of system 34 where the discharge path of phase 1 circuit 36 is not discharged as shown in the timing diagram of FIG. 4c, after the steady-state operation following t30 and before t31 phase 1 circuit 36 is in its precharge phase of operation while phase 2 circuit 42 is permitted to be in its evaluate phase of operation. Accordingly, precharge node $36_{PN}$ precharged high, which is inverted to a low by inverter $36_{INV}$ as shown in the fifth row of FIG. 4c and which is further inverted to a high as shown in the sixth row of FIG. 4c.

At t31, CLOCK transitions from high to low and thereby places phase 1 circuit 36 in its evaluate phase and phase 2 circuit 42 in its precharge phase. In addition, the low CLOCK enables discharge prevention transistor $38_{DPT}$. Further, recalling that the example of FIG. 4c occurs when the discharge path of phase 1 circuit 36 is not enabled (i.e., when the logic realized by logic circuit $36_L$ is false), then the low voltage output by inverter $36_{INV}$ is enabling to p-channel transistor $38_{PCH}$ which conducts and passes $V_{DD}$ to node $38_{N1}$, where it then passes via discharge prevention transistor $38_{DPT}$ to node $38_{N2}$, that is, to the output of inverter 38; as a result, after t31 there is no change in the output of either inverter $36_{INV}$ or $38_{INV}$, as shown in the fifth and sixth rows, respectively, of FIG. 4c. In addition, note during this time that the p-channel feedback transistor connected to the output of inverter $36_{INV}$ serves to maintain a high voltage at precharge node $36_{PN}$ so that the output of first inverter $36_{INV}$ remain lows and the output of second inverter $38_{INV}$ remains high.

At t32, CLOCK transitions from low to high, thereby placing phase 1 circuit 36 in its precharge phase and permitting phase 2 circuit 42 to be in its evaluate phase. In addition, the high CLOCK disables discharge prevention transistor $38_{DPT}$. Thus, inverter $36_{INV}$ continues to output a low to the gates of p-channel transistor $38_{PCH}$ and n-channel transistor $38_{NCH}$, but since discharge prevention transistor $38_{DPT}$ is disabled the inverting function of these two transistors does not occur; however, recall that inverters $40_{M1}$ and $40_{M2}$ are connected in a feedback loop to maintain a voltage at node $38_{N2}$; at this point, therefore, inverters $40_{M1}$ and $40_{M2}$ maintain the high voltage at node $38_{N2}$ since that voltage is not at this time provided via p-channel transistor $38_{PCH}$ (due to the disabling of discharge prevention transistor $38_{DPT}$), and the maintained high voltage is shown in the bottom row of FIG. 4c.

At t33, CLOCK transitions from high to low, once again placing phase 1 circuit 36 in its evaluate phase and phase 2 circuit 42 in its precharge phase. In addition, this transition enables discharge prevention transistor $38_{DPT}$ and thereby again enables the inverting function of inverter $38_{INV}$. Thus, once discharge prevention transistor $38_{DPT}$ conducts, it passes the high voltage provided from already-enabled p-channel transistor $38_{PCH}$ to the output of inverter $38_{INV}$, thereby maintaining a high output after t33 as shown in the bottom row of FIG. 4c.

Given the above, one skilled in the art will appreciate that system 34 also provides an inverting hold time latch. Specifically, if precharge node $36_{PN}$ does discharge for a given evaluate phase of phase 1 circuit 34, then precharge node $42_{PN}$ cannot discharge in the next successive evaluate phase of phase 2 circuit 42; thus, for system 34, its second stage cannot change state during its evaluate phase if its first stage changed state during its immediately preceding evaluate phase. The preceding further demonstrates that if precharge node $36_{PN}$ does not discharge for a given evaluate phase of phase 1 circuit 36, then precharge node $42_{PN}$ may discharge in the next successive evaluate phase of phase 2 circuit 42; thus, for system 34, its second stage can change state during its evaluate phase only if its first stage did not change state during its immediately preceding evaluate phase.

Figure 4D:
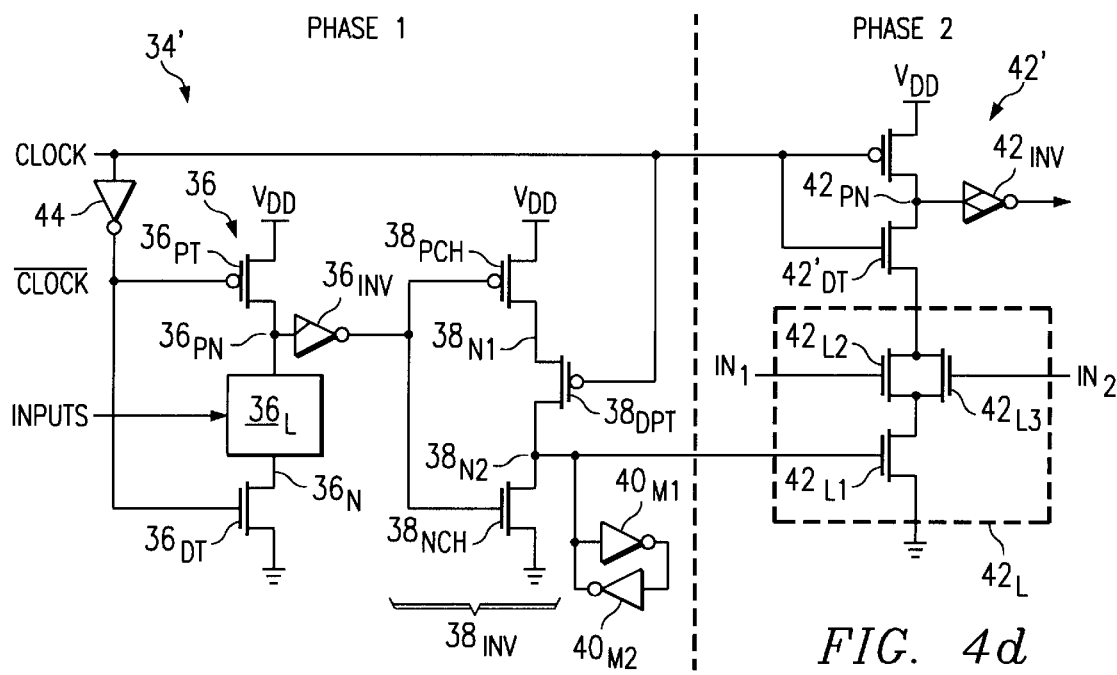
FIG. 4d illustrates a schematic of an inventive inverting hold time latch embodiment similar to that of FIG. 4a, where in FIG. 4d the transistor driven in a second domino logic circuit by a node in first domino logic circuit has its source connected to ground.

FIG. 4d illustrates a schematic of another inventive hold time latch system 34' and which is the same in many respects as system 34 shown in FIG. 4a; indeed, phase 1 circuit 36 in both FIGS. 4a and 4d is identical and the change between the systems is now explored and is shown with respect to phase 2 circuit 42'. Specifically, phase 2 circuit 42' includes the same components as phase 2 circuit 42 shown in FIG. 4a, but the location of the transistor being driven by node $38_{N2}$ is changed. Looking to these changes, in FIG. 4d precharge node $42_{PN}$ is connected directly to the drain of discharge transistor $42'_{DT}$, and logic circuit $42_L$ is connected between the source of discharge transistor $42'_{DT}$ and ground; accordingly, looking briefly back to FIG. 4a by way of contrast, in its implementation the transistor (not expressly shown) in logic circuit $42_L$ driven by node $38_{N2}$ has its source coupled to the drain of discharge transistor $42_{DT}$ and, thus, its source may float to a potential greater than ground, whereas in FIG. 4d a transistor $42_{L1}$ in logic circuit $42_L$ and driven by node $38_{N2}$ has its source directly connected to ground. Additionally, to further illustrate the changed location of this driven transistor, logic circuit $42_L$ is expanded to show an example of an actual logic circuit which includes transistor $42_{L1}$ and further includes two additional n-channel transistors $42_{L2}$ and $42_{L3}$ having their sources connected to the drain of transistor $42_{L1}$ and their drains connected to the source of discharge transistor $42'_{DT}$. For sake of reference, transistor $42_{L2}$ is shown receiving an input $IN_1$ and transistor $42_{L3}$ is shown receiving an input $IN_2$.

The operation of system 34' is generally the same as system 34 and, thus, the reader is referred to the earlier discussion for additional detail; however, attention is noteworthy with respect to the operational effect arising from the location of transistor $42_{L1}$. To appreciate this operational effect, however, attention is returned to system 34 of FIG. 4a. Specifically, assume in a particular instance that phase 1 circuit 36 is in its evaluate phase and does not discharge while phase 2 circuit 42 is in its precharge phase. From the earlier discussion, it should be appreciated that at this time node $38_{N2}$ is high. Further, because of the precharging of phase 2 circuit 42, various nodes in that circuit will or may be precharged to a voltage greater than ground. Next, assume that phase 1 circuit 36 switches to its precharge phase while phase 2 circuit 42 switches to its evaluate phase. First, recall in this instance that inverter $40_{M2}$ will initially hold node $38_{N2}$ high; however, this is a relatively weakly maintained state arising from the necessary sizing considerations for implementing an operable circuit. Second, note that once the transistor within logic circuit $42_L$ that is driven by node $38_{N2}$ begins to evaluate, the floating source voltage from that transistor may couple back to the gate of that transistor and thereby pull down the voltage on node $38_{N2}$ that is driving that gate. Of course, inverter $40_{M2}$ may operate to overcome this pull-down effect, but nonetheless a slight signal change may be observed; indeed, in a worst case scenario, this pull-down effect might flip the state of the inverter combination $40_{M1}$ and $40_{M2}$.

Given the preceding, attention is now returned to FIG. 4d and its system 34'. In the case of system 34', it is seen that the transistor that is part of the logic equation realized by phase 2 circuit 42' and driven by node $38_{N2}$ is preferably located as the lowest connected transistor in the discharge path between precharge node $42_{PN}$ and ground, that is, transistor $42_{L1}$ has its source connected directly to ground. As a result, if the example of the preceding paragraph is now traced through the operation of system 34', it will be confirmed that during the precharge phase of phase 2 circuit 42, the source of transistor $42_{L1}$ necessarily stays at ground. Accordingly, when transistor $42_{L1}$ next begins to evaluate, there is no coupling back of an above-ground voltage from the source of transistor $42_{L1}$ to its gate and, hence, there is no additional load on node $38_{N2}$ as described above with respect to system 34. From the above, therefore, one skilled in the art should appreciate that in many instances it may be preferred to have the transistor that is driven by node $38_{N2}$ to be located as the lowest connected transistor in the discharge path of phase 2 circuit 42'. Of course, such an approach is only feasible where logic circuit $42_L$ includes at least one transistor that is not connected in parallel to other transistors, and this one transistor may then be driven by node $38_{N2}$ and located as shown in FIG. 4d.

The preceding embodiments have shown by way of example various embodiments of inverting latches where the discharge paths of both stages in the inverting latch system are through like conductivity type transistors and, more particularly, are through n-channel transistors; however, FIG. 5a illustrates an inverting latch system 50 with two stages operating in different phases, but in FIG. 5a one stage has a discharge path through transistors of a first conductivity type (e.g., n-channel) while another stage has a path through transistors of a second and complementary conductivity type (e.g., p-channel). Turning to system 50, a vertical dashed line generally separates the stages, and looking to the left side of the vertical dashed line is the first stage which is the same as that of system 18 of FIG. 2a with two exceptions and, thus, it is identified as phase 1 circuit 20 and uses the same other reference numbers as used in FIG. 2a. The two exceptions are: (1) both stages are directly clocked by CLOCK and, hence, inverter 24 from FIG. 2a is removed; and (2) precharge node $20_{PN}$ is connected only through a single inverter $20_{INV1}$ to the second stage of the inverting latch and, hence, there is no second inverter $20_{INV2}$ as there is in system 18 of FIG. 2a. The second stage of inverting latch system 50 is identified as phase 2 circuit 52, and is detailed below.

Looking to the right side of the vertical line in FIG. 5a, there is shown phase 2 circuit 52 which includes a precharge transistor $52_{PT}$, a precharge node $52_{PN}$, an output inverter $52_{INV}$, and a discharge path including a logic circuit $52_L$, a discharge transistor $52_{DT}$, and a discharge prevention transistor $52_{DPT}$. More particularly to these devices and their connections, precharge transistor $52_{PT}$ is an n-channel transistor and, thus, is of a complementary conductivity type as compared to the p-channel precharge transistor $20_{PT}$ of phase 1 circuit 20. Precharge transistor $52_{PT}$ has a source connected to ground, a drain connected to precharge node $52_{PN}$, and a gate connected directly to CLOCK. CLOCK is also connected to the gate of discharge transistor $52_{DT}$, which is of a complementary conductivity type as compared to the n-channel discharge transistor $20_{DT}$ of phase 1 circuit 20 and, thus, is a p-channel transistor. Discharge transistor $52_{DT}$ has its source connected to $V_{DD}$ and its drain connected to logic circuit $52_L$. Like the logic circuits in earlier embodiments, logic circuit $52_L$ may include one or more transistors for realizing one or more equations, and it receives an input from the first stage of the system (i.e., phase 1 circuit 20); however, a noteworthy distinction for the present embodiment is that the one or more transistors in logic circuit $52_L$ are of a complementary conductivity type relative to those in logic circuit $20_L$ of phase 1 circuit 20; thus, since logic circuit $20_L$ is formed using one or more n-channel transistors, then logic circuit $52_L$ is formed using one or more p-channel transistors. Completing the discharge path of phase 2 circuit 52, logic circuit $52_L$ is connected to the source of discharge prevention transistor $52_{DPT}$, which has its drain connected to precharge node $52_{PN}$ and its gate connected to receive $CLOCK_F$; additionally, since it is part of the discharge path of phase 2 circuit 52, discharge prevention transistor $52_{DPT}$ is also a p-channel transistor. The input of an inverter $52_{INV}$ is connected to precharge node $52_{PN}$, and provides the output for phase 2 circuit 52. Lastly, $CLOCK_F$ for purposes of system 50 may be generated in the same manners as described earlier with previous embodiments, although it should transition in a complementary fashion as further appreciated from the following discussion of the operation of system 50.

The operation of system 50 is now presented with reference to the timing diagram of FIG. 5b, and should be appreciated further given the comparable aspects between it and the earlier embodiments. At the outset, note that FIG. 5b illustrates the operation of system 50 in an instance where the discharge path of phase 1 circuit 20 is enabled which thereby discharges precharge node $20_{PN}$, that is, FIG. 5b illustrates the example where the first stage of system 50 changes state. Looking now at the signals shown in FIG. 5b, the top row illustrates CLOCK, and note that its complement is not shown because the complement is not used in system 50. The second, third, and fourth rows are the same as shown in the third, fourth, and fifth rows, respectively, of FIG. 2b. The bottom row illustrates $CLOCK_F$, which for reasons more clear below is complementary to the $CLOCK_F$ signal shown in FIG. 2b.

Turning to the specific signals in FIG. 5b, after a time t40 representing a steady-state operation of system 50 and before t41, CLOCK is low thereby placing phase 1 circuit 20 in its precharge phase and permitting phase 2 circuit 52 to be in its evaluate phase. The precharge phase of phase 1 circuit 20 precharges its precharge node $20_{PN}$ to a high potential, and that signal is inverted so that inverter $20_{INV1}$ outputs a low as shown in the fourth row of FIG. 5b.

At t41, CLOCK transitions from high to low thereby placing phase 1 circuit 20 in its evaluate phase and phase 2 circuit 52 in its precharge phase. Recalling that FIG. 5b depicts the example of a state change for phase 1 circuit 20, then the during its evaluate phase it is assumed that a condition is satisfied according to a logic equation provided by logic circuit $20_L$ and, thus, a conductive path is formed through logic circuit $20_L$. Since discharge transistor $20_{DT}$ is also enabled at this time, then precharge node $20_{PN}$ discharges its high voltage to ground. Accordingly, after some delay between t41 and t41.1, and in response to the discharging voltage, the output of inverter $20_{INV1}$ rises from low to high. As to phase 2 circuit 50, because of its complementary conductivity type transistors, note that during its precharge phase it precharges precharge node $52_{PN}$ to ground; thus, a "precharge" in this case of a complementary conductivity configuration is to a relatively low potential, that being the voltage coupled to precharge node $52_{PN}$ during the precharge phase of phase 2 circuit 52, and a "discharge" will occur if this precharge potential of ground is thereafter changed to a relatively high potential (e.g., $V_{DD}$). Lastly, note that $CLOCK_F$ transitions low at t41, for reasons more clear below.

At t42, CLOCK transitions from low to high thereby placing phase 1 circuit 20 in its precharge phase and permitting phase 2 circuit 52 to be in its evaluate phase. The precharge phase of phase 1 circuit 20 once more precharges its precharge node $20_{PN}$ to a high voltage and, thus, after some hold time represented between t42 and t42.1, once more the output of inverter $20_{INV1}$ unconditionally returns to a low value. During the hold time between t42 and t42.1, note that the output of phase 1 circuit 20 is high; however, because logic circuit $52_L$, which receives this high as an input, is formed using one or more p-channel transistors, this high signal is not enabling to second phase circuit 52. As a result, even though phase 2 circuit 52 is in its evaluate phase because its discharge transistor $52_{DT}$ is enabled, the discharge path of phase 2 circuit 52 is not enabled in its entirety and, thus, there is no change in state in this second stage of system 50. Accordingly, one skilled in the art will once more appreciate that an inverting hold time latch functionality is provided in that a change in state in the first stage during its evaluate state prevents the second stage from changing state during its immediately following evaluate state.

At t42.1, $CLOCK_F$ rises and the output of inverter $20_{INV1}$ begins its transition downward in response to the precharging of precharge node $20_{PN}$. With respect to the rise in $CLOCK_F$, note that it disables discharge prevention transistor $52_{DPT}$ because that transistor is a p-channel transistor. Once more, therefore, the disabling of a discharge prevention transistor disables the discharge path of a domino logic stage as with earlier embodiments. Further, because the output of inverter $20_{INV1}$ unconditionally falls to a low level, that low level is enabling to a p-channel transistor in logic circuit $52_L$, and, therefore, logic circuit $52_L$, in response to this low can enable a path from the drain of discharge transistor $52_{DT}$ to the source of discharge prevention transistor $52_{DPT}$; however, because discharge prevention transistor $52_{DPT}$ is disabled at or around the same time, there is no change in state of phase 2 circuit 52.

Given the preceding description of system 50 as well as the recognition of its comparable aspects to earlier embodiments, a few additional observations may be made. As one observation, from the earlier discussion and without additional timing diagrams, the opposite instance of FIG. 5b, that is, where phase 1 circuit 20 does not change state, may be examined in summary. In this case, the output of inverter $20_{INV1}$ remains low and is potentially enabling to the p-channel transistor(s) of logic circuit $52_L$. Accordingly, only when phase 1 circuit 20 does not change state may phase 2 circuit 52 change state. As another observation, while system 50 illustrates a first stage having a discharge path through n-channel transistors and a second stage have a discharge path through p-channel transistors, still another embodiment would reverse these device types, thereby providing an inverting latch system where the first stage has a discharge path through p-channel transistors and the second stage has a discharge path through n-channel transistors. As still another observation, the above embodiments have shown a precharge to $V_{DD}$ (e.g., for an n-channel precharge transistor) or ground (e.g., for a p-channel precharge transistor), and a discharge to ground (e.g., for an n-channel precharge transistor) or $V_{DD}$ (e.g., for a p-channel precharge transistor). However, it should be understood that the precharge and discharge potentials could be other levels, with it therefore understood that the act of precharging is enabling a path to the precharge node so that it is charged to a first potential, while the act of discharging is enabling a different path (i.e., the discharge path) to the precharge node so that its potential is changed to a second and different potential.

Having presented numerous embodiments and having discussed further variations thereof, it is now instructive to observe that while the present inventive embodiments may depart from one another in device types and configurations, they do share various attributes, while recognizing that these attributes are achieved in differing manners. These attributes along with some examples are as follows:

(1) The state of the second stage is responsive to the precharge node of the first stage, and the responsiveness may be either by direct connection or through various circuitry. For example, a direct connection of the first stage precharge node is shown in system 26 (FIG. 3*a*), while an indirect connection is shown by various other examples, such as system 18 (FIG. 2*a*) and system 33 (FIG. 3*d*) through two inverters, and system 34 (FIG. 4*a*) showing a connection through two inverters, where the second inverter is selectively disabled, and system 50 (FIG. 5*a*) showing a connection through a single inverter.

(2) During its precharge phase the first stage precharge node unconditionally charges its precharge node to a first voltage. For example, a precharge voltage equal to $V_{DD}$ is shown in system 18 (FIG. 2*a*), system 26 (FIG. 3*a*), system 33 (FIG. 3*d*), and system 34 (FIG. 4*a*), while a precharge voltage of ground could be realized by reversing the transistor conductivity types in system 50 (FIG. 5*a*).

(3) During its evaluate phase the first stage precharge node conditionally changes state to a second voltage (see all embodiments).

(4) If the conditional change during the evaluate phase of the first stage occurs, it will not cause a state change in the second stage during the immediately following evaluate phase of the second stage (see all embodiments).

(5) The second stage may change state during its evaluate phase only if the first stage did not change state during its immediately preceding evaluate phase (see all embodiments).

(6) Each embodiment preferably includes a discharge prevention structure which prevents the second stage from changing state in response to the unconditional return of the precharge node of the first stage to the precharge voltage. One approach is to include a discharge prevention transistor in the discharge path of the second stage, such as shown in system 18 (FIG. 2*a*), system 26 (FIG. 3*a*), system 33 (FIG. 3*d*), system 34 (FIG. 4*a*), and system 50 (FIG. 5*a*). Another approach is to include a discharge prevention transistor in the output circuitry of the first stage, such as shown in system 34 (FIG. 4*a*).

As a final matter, it is noted that the systems described above have been simplified in that each illustrates only a single discharge path in the second stage; however, in many actual implementations, the second stage (and first stage) may be part of a larger network of circuits, and in this regard the second stage may include other discharge paths which are not shown in the present document since those other discharge paths will be under control of other inputs not related to the first stages shown in this document. Thus, the aspects of the preferred non-inverting latches discussed above hold true insofar as the relationship is detailed between the second stage in response to the discharge, or lack thereof, of the first stage; however, it should be understood that if the second stage includes additional discharge paths, then each of those paths may be enabled by other circuits and irrespective of the operation of the first stages shown above. Accordingly, if one or more of those additional discharge paths are enabled, then the second stage could discharge even if the first stage illustrated in the previous Figures also discharged; however, in such an event, the discharge of the second stage is not in response to the activity of the first stage shown and described above, but instead it is governed by some other circuit which is not germane to the non-inverting latch behavior described above.

From the above, it may be appreciated that the above embodiments provide numerous advantages over the prior art. For example, an inverting hold time latch functionality is provided which may therefore provide a complementary operation to prior art hold time latches. As another example, the present embodiments span a wide range of examples, as shown by the various Figures as well as the additional statements setting forth other examples as well. Moreover, a person skilled in the art will appreciate still other alternative implementations of the present embodiments. For example, while only two phases are shown in the preceding embodiments, alternative implementations could include multiple phases, whereby each successive phase evaluates out of phase with respect to the preceding phase. Indeed, a person skilled in the art may readily apply the above to still further embodiments not specifically shown above. Consequently, while the present embodiments have been described in detail, various substitutions, modifications or alterations could be made to the descriptions set forth above without departing from the inventive scope which is defined by the claims set forth below.

What is claimed is:

1. A domino logic circuit, comprising:
   a first phase domino logic circuit operable in a precharge phase and an evaluate phase, wherein the first phase domino logic circuit comprises a precharge node operable to change states; and
   a second phase domino logic circuit operable in a precharge phase and an evaluate phase, wherein the precharge phase and the evaluate phase of the first phase domino logic circuit are out of phase with respect to the precharge phase and the evaluate phase of the second phase domino logic circuit, and wherein the second phase domino logic circuit comprises a precharge node operable to change states in response to the states of the first phase domino logic circuit;
   wherein each of the first and second phase domino logic circuits further comprises:
      a coupling device which when conducting couples the precharge node to a precharge voltage during the precharge phase; and a discharge path connected to the precharge node which when conducting couples the precharge node to a voltage different than the precharge voltage during the evaluate phase, wherein the discharge path comprises logic circuitry;

wherein the first phase domino logic circuit is operable such that:
the precharge node of the first phase domino logic circuit is charged to a first state during the precharge phase of the first phase domino logic circuit;
the precharge node of the first phase domino logic circuit conditionally changes to a second state during the evaluate phase of the first phase domino logic circuit;

wherein the second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit;

wherein the second phase domino logic circuit is further operable such that the state of the precharge node of the second phase domino logic circuit may not change in the evaluate phase of the second phase domino logic circuit in response to the first phase domino logic circuit when the state of the precharge node of the first phase domino logic circuit changed in an immediately preceding evaluate phase of the first phase domino logic circuit; and further comprising circuitry for preventing the state of the precharge node of the second phase domino logic circuit from changing in response to the precharge node of the first phase domino logic circuit being charged to the first state during the precharge phase of the first phase domino logic circuit.

2. The domino logic circuit of claim 1 wherein the circuitry for preventing comprises a selectively enabled transistor in the discharge path of the second phase domino logic circuit.

3. The domino logic circuit of claim 1 wherein the circuitry for preventing comprises a selectively enabled transistor in an output inverter coupled to the precharge node of the first phase domino logic circuit.

4. A domino logic circuit, comprising:
a first phase domino logic circuit operable in a precharge phase and an evaluate phase, wherein the first phase domino logic circuit comprises a precharge node operable to change states; and
a second phase domino logic circuit operable in a precharge phase and an evaluate phase, wherein the precharge phase and the evaluate phase of the first phase domino logic circuit are out of phase with respect to the precharge phase and the evaluate phase of the second phase domino logic circuit, and wherein the second phase domino logic circuit comprises a precharge node operable to change states in response to the states of the first phase domino logic circuit;

wherein each of the first and second phase domino logic circuits further comprises:
a coupling device which when conducting couples the precharge node to a precharge voltage during the precharge phase; and
a discharge path connected to the precharge node which when conducting couples the precharge node to a voltage different than the precharge voltage during the evaluate phase, wherein the discharge path comprises logic circuitry;

wherein the first phase domino logic circuit is operable such that:
the precharge node of the first phase domino logic circuit is charged to a first state during the precharge phase of the first phase domino logic circuit;
the precharge node of the first phase domino logic circuit conditionally changes to a second state during the evaluate phase of the first phase domino logic circuit;

wherein the second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit;

wherein the first phase domino logic circuit further comprises:
a first inverter having an input connected to the precharge node of the first phase domino logic circuit; and
a second inverter having an input connected to an output of the first inverter and having an output;

wherein the logic circuitry of the second phase domino logic circuit comprises an input coupled to the output of the second inverter;

wherein the output of the second inverter is operable to unconditionally change states during the evaluate phase of the second phase domino logic circuit;

wherein the discharge path of the second phase domino logic circuit comprises a discharge prevention transistor having a gate coupled to receive a control signal; and wherein the control signal is operable to open the discharge path of the second phase domino logic circuit after the second phase domino logic circuit evaluates and no later than approximately a time when the output of the second inverter unconditionally changes state during the evaluate phase of the second phase domino logic circuit.

5. The domino logic circuit of claim 4 wherein the control signal is operable to enable the discharge prevention transistor during a portion of the evaluate phase of the second phase domino logic circuit.

6. A domino logic circuit, comprising:
a first phase domino logic circuit operable in a precharge phase and an evaluate phase, wherein the first phase domino logic circuit comprises a precharge node operable to change states; and
a second phase domino logic circuit operable in a precharge phase and an evaluate phase, wherein the precharge phase and the evaluate phase of the first phase domino logic circuit are out of phase with respect to the precharge phase and the evaluate phase of the second phase domino logic circuit, and wherein the second phase domino logic circuit comprises a precharge node operable to change states in response to the states of the first phase domino logic circuit;

wherein each of the first and second phase domino logic circuits further comprises:

a coupling device which when conducting couples the precharge node to a precharge voltage during the precharge phase; and a discharge path connected to the precharge node which when conducting couples the precharge node to a voltage different than the precharge voltage during the evaluate phase, wherein the discharge path comprises logic circuitry;

wherein the first phase domino logic circuit is operable such that:

the precharge node of the first phase domino logic circuit is charged to a first state during the precharge phase of the first phase domino logic circuit;

the precharge node of the first phase domino logic circuit conditionally changes to a second state during the evaluate phase of the first phase domino logic circuit;

wherein the second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit;

wherein the logic circuitry of the second phase domino logic circuit comprises an input coupled to the precharge node of the first phase domino logic circuit;

wherein the precharge node of the first phase domino logic circuit is operable to unconditionally change states during the evaluate phase of the second phase domino logic circuit;

wherein the discharge path of the second phase domino logic circuit comprises a discharge prevention transistor having a gate coupled to receive a control signal; and wherein the control signal is operable to disable the discharge prevention transistor so that to open the discharge path of the second phase domino logic circuit after the second phase domino logic circuit evaluates and no later than approximately a time when the output of the second inverter unconditionally changes state during the evaluate phase of the second phase domino logic circuit.

7. The domino logic circuit of claim 6 wherein the control signal is operable to enable the discharge prevention transistor during a portion of the evaluate phase of the second phase domino logic circuit.

8. The domino logic circuit of claim 7 wherein the discharge prevention transistor comprises a source/drain region connected to the precharge node of the second phase domino logic circuit.

9. The domino logic circuit of claim 6 wherein the discharge prevention transistor comprises a source/drain region connected to the precharge node of the second phase domino logic circuit.

10. A domino logic circuit, comprising:

a first phase domino logic circuit operable in a precharge phase and an evaluate phase, wherein the first phase domino logic circuit comprises a precharge node operable to change states; and a second phase domino logic circuit operable in a precharge phase and an evaluate phase, wherein the precharge phase and the evaluate phase of the first phase domino logic circuit are out of phase with respect to the precharge phase and the evaluate phase of the second phase domino logic circuit, and wherein the second phase domino logic circuit comprises a precharge node operable to change states in response to the states of the first phase domino logic circuit;

wherein each of the first and second phase domino logic circuits further comprises:

a coupling device which when conducting couples the precharge node to a precharge voltage during the precharge phase; and a discharge path connected to the precharge node which when conducting couples the precharge node to a voltage different than the precharge voltage during the evaluate phase, wherein the discharge path comprises logic circuitry;

wherein the first phase domino logic circuit is operable such that:

the precharge node of the first phase domino logic circuit is charged to a first state during the precharge phase of the first phase domino logic circuit;

the precharge node of the first phase domino logic circuit conditionally changes to a second state during the evaluate phase of the first phase domino logic circuit;

wherein the second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit;

wherein the logic circuitry of the discharge path of the second phase domino logic circuit comprises a transistor configuration for realizing a logic equation;

wherein the transistor configuration comprises at least one transistor having a gate coupled to the precharge node of the first phase domino logic circuit and having a source/drain region connected to a source of the voltage different than the precharge voltage;

wherein the discharge path of the second phase domino logic circuit further includes a discharge prevention transistor comprises a source/drain region connected to the precharge node of the second phase domino logic circuit;

wherein the logic circuitry of the discharge path of the second phase domino logic circuit comprises a transistor configuration for realizing a logic equation; and wherein the transistor configuration comprises at least one transistor having a gate coupled to the output of the first phase domino logic circuit and having a source/drain region connected to a source of the voltage different than the precharge voltage.

11. A domino logic circuit, comprising:

a first phase domino logic circuit operable in a precharge phase and an evaluate phase, wherein the first phase domino logic circuit comprises a precharge node operable to change states; and a second phase domino logic circuit operable in a precharge phase and an evaluate phase, wherein the precharge phase and the evaluate phase of the first phase domino logic circuit are out of phase with respect to the precharge phase and the evaluate phase of the second phase domino logic circuit, and wherein the second phase domino logic circuit comprises a precharge node operable to change states in response to the states of the first phase domino logic circuit;

wherein each of the first and second phase domino logic circuits further comprises:
 a coupling device which when conducting couples the precharge node to a precharge voltage during the precharge phase; and
 a discharge path connected to the precharge node which when conducting couples the precharge node to a voltage different than the precharge voltage during the evaluate phase, wherein the discharge path comprises logic circuitry;

wherein the first phase domino logic circuit is operable such that:
 the precharge node of the first phase domino logic circuit is charged to a first state during the precharge phase of the first phase domino logic circuit;
 the precharge node of the first phase domino logic circuit conditionally changes to a second state during the evaluate phase of the first phase domino logic circuit;

wherein the second phase domino logic circuit is operable such that the state of the precharge node of the second phase domino logic circuit may change in the evaluate phase of the second phase domino logic circuit and in response to the first phase domino logic circuit only when the state of the precharge node of the first phase domino logic circuit did not change in an immediately preceding evaluate phase of the first phase domino logic circuit;

wherein the first phase domino logic circuit further comprises:
 a first inverter having an input connected to the precharge node of the first phase domino logic circuit; and
 a second inverter having an input connected to an output of the first inverter and having an output, wherein the second inverter further comprises a discharge prevention transistor having a gate for receiving a control signal, wherein the discharge prevention transistor is operable in response to the control signal to selectively disable the output of the second inverter from providing a signal to enable the discharge path of the second phase domino logic circuit.

12. The domino logic circuit of claim 11 wherein the control signal is operable to disable the output of the second inverter from providing the signal during the evaluate phase of the second phase domino logic circuit when there is a discharge of the precharge voltage of the first phase domino logic circuit.

13. The domino logic circuit of claim 12 wherein the control signal is operable to enable the output of the second inverter during the evaluate phase of the first phase domino logic circuit.

14. A two-stage precharge-conditional discharge domino logic circuit operating responsive to a clock signal and at least one input signal, comprising:
 a first stage including
  a first precharge node;
  a first precharge transistor having a source-drain path connected between a first voltage and said first precharge node and a gate receiving the clock signal, the first precharge transistor conducting during a first phase of the clock signal to precharge the first precharge node to the first voltage;
  a first conditional discharge series path connected between the first precharge node and a second voltage different than the first voltage, the first conditional discharge series path including
   a first logic circuit having first and second terminals disposed in the first conditional discharge series path and receiving at least one input signal, the first logic circuit forming a conduction path between the first and second terminals when the at least one input signal has a predetermined logic state,
   a first discharge transistor having a source-drain path disposed in the first conditional discharge series path and a gate receiving the clock signal, the first discharge transistor conducting during a second phase of the clock signal opposite to the first phase of the clock signal to permit discharge of the first precharge node to the second voltage if the first logic circuit is conducting;
 a second stage including
  a second precharge node;
  a second precharge transistor having a source-drain path connected between the first voltage and said second precharge node and a gate receiving the clock signal, the second precharge transistor conducting during the second phase of the clock signal to precharge the second precharge node to the first voltage;
  a second conditional discharge series path connected between the second precharge node and the second voltage, the second conditional discharge series path including
   a second logic circuit having first and second terminals disposed in the first conditional discharge series path and receiving at least one input signal including a signal corresponding to the first precharge node, the second logic circuit forming a conduction path between the first and second terminals when the at least one input signal has a predetermined logic state,
   a discharge prevention transistor having a source-drain path disposed in the second conditional discharge series path and a gate receiving a control signal, the discharge prevention transistor not conducting during a initial portion of the first phase of the clock signal thereby preventing discharge of the second precharge node to the second voltage; and
   a second discharge transistor having a source-drain path disposed in the second conditional discharge series path and a gate receiving the clock signal, the second discharge transistor conducting during the first phase of the clock signal to permit discharge of the second precharge node to the second voltage if the second logic circuit and the discharge prevention transistor are both conducting.

15. The two-stage precharge-conditional discharge domino logic circuit of claim 14, wherein:
 the second logic circuit has the first terminal connected to the second precharge node; and
 further including
  a first inverter having an input connected to the first precharge node and an output,
  a second inverter having an input connected to the output of the first inverter and an output connected to the second logic circuit forming the signal corresponding to the first precharge node.

16. The two-stage precharge-conditional discharge domino logic circuit of claim 14, wherein:

the second logic circuit has the second terminal connected to the second voltage and includes a first logic transistor having a source-drain path connected to the second terminal and a gate connected directly to the first precharge node thereby receiving the signal corresponding to the first precharge node.

17. The two-stage precharge-conditional discharge domino logic circuit of claim 16, wherein:

the second logic circuit has at least one second logic transistor having a source-drain path connect between the first terminal and the source-drain path of the first logic transistor.

18. A two-stage precharge-conditional discharge domino logic circuit operating responsive to a clock signal and at least one input signal, comprising:

a first stage including a first precharge node;

a first precharge transistor having a source-drain path connected between a first voltage and said first precharge node and a gate receiving the clock signal, the first precharge transistor conducting during a first phase of the clock signal to precharge the first precharge node to the first voltage;

a first conditional discharge series path connected between the first precharge node and a second voltage different than the first voltage, the first conditional discharge series path including a first logic circuit having first and second terminals disposed in the first conditional discharge series path and receiving at least one input signal, the first logic circuit forming a conduction path between the first and second terminals when the at least one input signal has a predetermined logic state, a first discharge transistor having a source-drain path disposed in the first conditional discharge series path and a gate receiving the clock signal, the first discharge transistor conducting during a second phase of the clock signal opposite to the first phase of the clock signal to permit discharge of the first precharge node to the second voltage if the first logic circuit is conducting, an inverter having an input connected to the first precharge node and an output;

a second stage including a second precharge node;

a second precharge transistor having a source-drain path connected between the first voltage and said second precharge node and a gate receiving the clock signal, the second precharge transistor conducting during the second phase of the clock signal to precharge the second precharge node to the first voltage;

a second conditional discharge series path connected between the second precharge node and the output of the inverter, the second conditional discharge series path including a discharge prevention transistor having a source-drain path disposed in the second conditional discharge series path and a gate receiving a control signal, the discharge prevention transistor not conducting during a initial portion of the first phase of the clock signal thereby preventing discharge of the second precharge node to the second voltage; and a second discharge transistor having a source-drain path disposed in the second conditional discharge series path and a gate receiving the clock signal, the second discharge transistor conducting during the first phase of the clock signal to permit discharge of the second precharge node to the second voltage if the second logic circuit and the discharge prevention transistor are both conducting.

19. A two-stage precharge-conditional discharge domino logic circuit operating responsive to a clock signal and at least one input signal, comprising:

a first stage including a first precharge node;

a first precharge transistor having a source-drain path connected between a first voltage and said first precharge node and a gate receiving the clock signal, the first precharge transistor conducting during a first phase of the clock signal to precharge the first precharge node to the first voltage;

a first conditional discharge series path connected between the first precharge node and a second voltage different than the first voltage, the first conditional discharge series path including a first logic circuit having first and second terminals disposed in the first conditional discharge series path and receiving at least one input signal, the first logic circuit forming a conduction path between the first and second terminals when the at least one input signal has a predetermined logic state, a first discharge transistor having a source-drain path disposed in the first conditional discharge series path and a gate receiving the clock signal, the first discharge transistor conducting during a second phase of the clock signal opposite to the first phase of the clock signal to permit discharge of the first precharge node to the second voltage if the first logic circuit is conducting, a first inverter having an input connected to the first precharge node and an output, a second inverter having an input connected to the output of the first inverter and an output, the second inverter including a first inverter transistor having a source-drain path connected between the first voltage and an inverter intermediate node and a gate connected to the input, a second inverter transistor having a source-drain path connected between the output and the second voltage and a gate connected to the input, a discharge prevention transistor having a source-drain path connected between the inverter intermediate node and the output and a gate receiving the clock signal, the discharge prevention transistor not conducting during the first phase of the clock signal, a latch connected to the output of the second inverter for maintaining a prior voltage at the output of the second inverter during the first phase of the clock signal; a second stage including a second precharge node;

a second precharge transistor having a source-drain path connected between the first voltage and said second precharge node and a gate receiving the clock signal, the second precharge transistor conducting during the second phase of the clock signal to precharge the second precharge node to the first voltage;

a second conditional discharge series path connected between the second precharge node and the second voltage, the second conditional discharge series path including a second logic circuit having first and second terminals disposed in the first conditional discharge series path and receiving at least one input signal including the output of the second inverter, the second logic circuit forming a conduction path between the first and second terminals when the at least one input signal has a predetermined logic state, a second discharge transistor having a source-drain path disposed in the second conditional discharge series path and a gate receiving the clock signal, the second discharge transistor conducting during the first phase of the clock signal to permit discharge of the second precharge node to the second voltage if the second logic circuit is both conducting.

20. The two-stage precharge-conditional discharge domino logic circuit of claim 19, wherein:

the second logic circuit has the first terminal connected to the second precharge node; and the source-drain path of the discharge transistor is connected to the second voltage.

21. The two-stage precharge-conditional discharge domino logic circuit of claim 19, wherein:

the second logic circuit has the second terminal connected to the second voltage and includes a first logic transistor having a source-drain path connected to the second terminal and a gate connected to the output of the second inverter, thereby receiving the signal corresponding to the first precharge node.

22. The two-stage precharge-conditional discharge domino logic circuit of claim 21, wherein:

the second logic circuit has at least one second logic transistor having a source-drain path connect between the first terminal and the source-drain path of the first logic transistor.

23. A two-stage precharge-conditional discharge domino logic circuit operating responsive to a clock signal and at least one input signal, comprising:

a first stage including a first precharge node;

a first precharge transistor having a source-drain path connected between a first voltage and said first precharge node and a gate receiving the clock signal, the first precharge transistor conducting during a first phase of the clock signal to precharge the first precharge node to the first voltage;

a first conditional discharge series path connected between the first precharge node and a second voltage different than the first voltage, the first conditional discharge series path including a first logic circuit having first and second terminals disposed in the first conditional discharge series path and receiving at least one input signal, the first logic circuit forming a conduction path between the first and second terminals when the at least one input signal has a predetermined logic state, a first discharge transistor having a source-drain path disposed in the first conditional discharge series path and a gate receiving the clock signal, the first discharge transistor conducting during a second phase of the clock signal opposite to the first phase of the clock signal to permit discharge of the first precharge node to the second voltage if the first logic circuit is conducting, an inverter having an input connected to the first precharge node and an output;

a second stage including a second precharge node;

a second precharge transistor having a source-drain path connected between the second voltage and said second precharge node and a gate receiving the clock signal, the second precharge transistor conducting during the second phase of the clock signal to precharge the second precharge node to the second voltage;

a second conditional discharge series path connected between the second precharge node and the first voltage, the second conditional discharge series path including a second logic circuit having first and second terminals disposed in the first conditional discharge series path and receiving at least one input signal including the output of the inverter, the second logic circuit forming a conduction path between the first and second terminals when the at least one input signal has a predetermined logic state, a discharge prevention transistor having a source-drain path disposed in the second conditional discharge series path and a gate receiving a control signal, the discharge prevention transistor not conducting during a initial portion of the first phase of the clock signal thereby preventing discharge of the second precharge node to the first voltage; and a second discharge transistor having a source-drain path disposed in the second conditional discharge series path and a gate receiving the clock signal, the second discharge transistor conducting during the first phase of the clock signal to permit discharge of the second precharge node to the second voltage if the second logic circuit and the discharge prevention transistor are both conducting.

* * * * *